(12) United States Patent
Ahn et al.

(10) Patent No.: US 7,560,395 B2
(45) Date of Patent: Jul. 14, 2009

(54) ATOMIC LAYER DEPOSITED HAFNIUM TANTALUM OXIDE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 494 days.

(21) Appl. No.: 11/029,757

(22) Filed: Jan. 5, 2005

(65) Prior Publication Data

US 2006/0148180 A1    Jul. 6, 2006

(51) Int. Cl.
*H01L 21/31* (2006.01)
*H01L 21/469* (2006.01)

(52) U.S. Cl. ........................... 438/785; 438/778

(58) Field of Classification Search .............. 438/258, 438/286, 287, 767, 785
See application file for complete search history.

(56) References Cited

U.S. PATENT DOCUMENTS

| | | | |
|---|---|---|---|
| 3,357,961 A | 12/1967 | Makowski et al. |
| 4,542,870 A | 9/1985 | Howell |
| 5,049,516 A | 9/1991 | Arima |
| 5,119,329 A | 6/1992 | Evans et al. |
| 5,252,370 A | 10/1993 | Tominaga et al. |
| 5,304,622 A | 4/1994 | Ikai et al. |
| 5,334,433 A | 8/1994 | Tominaga |
| 5,364,708 A | 11/1994 | Tominaga |
| 5,401,609 A | 3/1995 | Haratani et al. |
| 5,406,546 A | 4/1995 | Uchiyama et al. |
| 5,418,030 A | 5/1995 | Tominaga et al. |
| 5,426,603 A | 6/1995 | Nakamura et al. |
| 5,430,706 A | 7/1995 | Utsunomiya et al. |
| 5,439,524 A | 8/1995 | Cain et al. |
| 5,470,628 A | 11/1995 | Tominaga et al. |
| 5,478,653 A | 12/1995 | Guenzer |
| 5,498,507 A | 3/1996 | Handa et al. |
| 5,523,140 A | 6/1996 | Tominaga et al. |

(Continued)

FOREIGN PATENT DOCUMENTS

EP    1096042    5/2001
WO    WO-2006026716 A1    3/2006

OTHER PUBLICATIONS

Conley, J. F., et al., "Atomic Layer Deposition of Hafnium Oxide Using Anhydrous Hafnium Nitrate", *Electrochemical and Solid-State Letters*, 5(5), (May 2002), C57-C59.

(Continued)

*Primary Examiner*—N Drew Richards
*Assistant Examiner*—Pamela E Perkins
(74) *Attorney, Agent, or Firm*—Schwegman, Lundberg & Woessner, P.A.

(57) ABSTRACT

A dielectric layer containing hafnium tantalum film arranged as a structure of one or more monolayers and a method of fabricating such a dielectric layer produce a dielectric layer for use in a variety of electronic devices. In an embodiment, a hafnium tantalum oxide film may be formed by depositing hafnium and tantalum by atomic layer deposition onto a substrate surface. Embodiments include structures for capacitors, transistors, memory devices, and electronic systems with dielectric layers containing a hafnium tantalum oxide film arranged as a structure of one or more monolayers, and methods for forming such structures.

38 Claims, 5 Drawing Sheets

U.S. PATENT DOCUMENTS

| | | |
|---|---|---|
| 5,552,237 A | 9/1996 | Utsunomiya et al. |
| 5,562,952 A | 10/1996 | Nakahigashi et al. |
| 5,569,517 A | 10/1996 | Tominaga et al. |
| 5,572,052 A | 11/1996 | Kashihara et al. |
| 5,577,020 A | 11/1996 | Utsunomiya et al. |
| 5,593,789 A | 1/1997 | Utsunomiya et al. |
| 5,620,766 A | 4/1997 | Uchiyama et al. |
| 5,627,012 A | 5/1997 | Tominaga et al. |
| 5,637,371 A | 6/1997 | Tominaga et al. |
| 5,637,372 A | 6/1997 | Tominaga et al. |
| 5,646,583 A | 7/1997 | Seabury et al. |
| 5,674,563 A | 10/1997 | Tarui et al. |
| 5,700,567 A | 12/1997 | Utsunomiya |
| 5,739,524 A | 4/1998 | Fally |
| 5,751,021 A | 5/1998 | Teraguchi |
| 5,777,923 A | 7/1998 | Lee et al. |
| 5,814,584 A | 9/1998 | Tauber et al. |
| 5,825,046 A | 10/1998 | Czubatyj et al. |
| 5,827,571 A | 10/1998 | Lee et al. |
| 5,891,542 A | 4/1999 | Tominaga et al. |
| 5,906,874 A | 5/1999 | Takahashi et al. |
| 5,958,140 A | 9/1999 | Arami et al. |
| 5,965,323 A | 10/1999 | Takahashi et al. |
| 5,981,014 A | 11/1999 | Tsukagoshi et al. |
| 5,999,454 A | 12/1999 | Smith |
| 6,002,418 A | 12/1999 | Yoneda et al. |
| 6,020,024 A * | 2/2000 | Maiti et al. .................. 438/287 |
| 6,025,225 A | 2/2000 | Forbes et al. |
| 6,030,679 A | 2/2000 | Saito et al. |
| 6,034,015 A | 3/2000 | Lin et al. |
| 6,040,030 A | 3/2000 | Utsunomiya et al. |
| 6,051,363 A | 4/2000 | Utsunomiya et al. |
| 6,060,755 A | 5/2000 | Ma et al. |
| 6,061,077 A | 5/2000 | Kashiwaya et al. |
| 6,063,705 A | 5/2000 | Vaartstra |
| 6,075,691 A | 6/2000 | Duenas et al. |
| 6,081,287 A | 6/2000 | Noshita et al. |
| 6,087,067 A | 7/2000 | Kato et al. |
| 6,087,674 A | 7/2000 | Ovshinsky et al. |
| 6,103,330 A | 8/2000 | Kosuda et al. |
| 6,115,401 A | 9/2000 | Scobey et al. |
| 6,134,175 A | 10/2000 | Forbes et al. |
| 6,136,168 A | 10/2000 | Masujima et al. |
| 6,137,520 A | 10/2000 | Kashiwaya et al. |
| 6,141,238 A | 10/2000 | Forbes et al. |
| 6,146,976 A | 11/2000 | Stecher et al. |
| 6,153,355 A | 11/2000 | Takahashi et al. |
| 6,173,379 B1 | 1/2001 | Poplingher et al. |
| 6,174,809 B1 | 1/2001 | Kang et al. |
| 6,175,377 B1 | 1/2001 | Noshita et al. |
| 6,191,448 B1 | 2/2001 | Forbes et al. |
| 6,191,470 B1 | 2/2001 | Forbes et al. |
| 6,200,893 B1 | 3/2001 | Sneh |
| 6,203,613 B1 | 3/2001 | Gates et al. |
| 6,207,522 B1 | 3/2001 | Hunt et al. |
| 6,242,157 B1 | 6/2001 | Tominaga et al. |
| 6,243,941 B1 | 6/2001 | Kashiwaya et al. |
| 6,249,460 B1 | 6/2001 | Forbes et al. |
| 6,255,852 B1 | 7/2001 | Forbes et al. |
| 6,256,052 B1 | 7/2001 | Yoneda |
| 6,256,053 B1 | 7/2001 | Noshita et al. |
| 6,270,835 B1 | 8/2001 | Hunt et al. |
| 6,274,937 B1 | 8/2001 | Ahn et al. |
| 6,281,042 B1 | 8/2001 | Ahn et al. |
| 6,289,842 B1 | 9/2001 | Tompa |
| 6,297,095 B1 | 10/2001 | Muralidhar et al. |
| 6,297,103 B1 | 10/2001 | Ahn et al. |
| 6,297,539 B1 | 10/2001 | Ma et al. |
| 6,313,035 B1 | 11/2001 | Sandhu et al. |
| 6,316,054 B1 | 11/2001 | Kashiwaya et al. |
| 6,317,357 B1 | 11/2001 | Forbes |
| 6,329,036 B1 | 12/2001 | Kikukawa et al. |
| 6,337,704 B1 | 1/2002 | Yamaguchi |
| 6,337,805 B1 | 1/2002 | Forbes et al. |
| 6,350,704 B1 | 2/2002 | Ahn et al. |
| 6,351,276 B1 | 2/2002 | Yamaguchi |
| 6,358,766 B1 | 3/2002 | Kasahara |
| 6,373,740 B1 | 4/2002 | Forbes et al. |
| 6,381,168 B2 | 4/2002 | Forbes |
| 6,383,861 B1 | 5/2002 | Gonzalez et al. |
| 6,392,257 B1 | 5/2002 | Ramdani et al. |
| 6,395,650 B1 | 5/2002 | Callegari et al. |
| 6,406,772 B2 | 6/2002 | Tominaga et al. |
| 6,407,427 B1 | 6/2002 | Oh |
| 6,407,435 B1 | 6/2002 | Ma et al. |
| 6,410,368 B1 | 6/2002 | Kawasaki et al. |
| 6,418,050 B2 | 7/2002 | Forbes |
| 6,420,279 B1 | 7/2002 | Ono et al. |
| 6,426,245 B1 | 7/2002 | Kawasaki et al. |
| 6,429,065 B2 | 8/2002 | Forbes |
| 6,433,993 B1 | 8/2002 | Hunt et al. |
| 6,434,041 B2 | 8/2002 | Forbes et al. |
| 6,441,417 B1 | 8/2002 | Zhang et al. |
| 6,444,592 B1 | 9/2002 | Ballantine et al. |
| 6,454,912 B1 | 9/2002 | Ahn et al. |
| 6,456,535 B2 | 9/2002 | Forbes et al. |
| 6,461,710 B1 | 10/2002 | Kikukawa et al. |
| 6,465,298 B2 | 10/2002 | Forbes et al. |
| 6,465,853 B1 | 10/2002 | Hobbs et al. |
| 6,492,233 B2 | 12/2002 | Forbes et al. |
| 6,492,659 B1 | 12/2002 | Yamazaki et al. |
| 6,495,436 B2 | 12/2002 | Ahn et al. |
| 6,498,065 B1 | 12/2002 | Forbes et al. |
| 6,509,280 B2 | 1/2003 | Choi |
| 6,514,820 B2 | 2/2003 | Ahn et al. |
| 6,514,828 B2 | 2/2003 | Ahn et al. |
| 6,531,354 B2 | 3/2003 | Maria et al. |
| 6,534,420 B2 | 3/2003 | Ahn et al. |
| 6,537,721 B2 | 3/2003 | Inoue et al. |
| 6,538,330 B1 | 3/2003 | Forbes |
| 6,541,079 B1 | 4/2003 | Bojarczuk, Jr. et al. |
| 6,541,280 B2 | 4/2003 | Kaushik et al. |
| 6,544,846 B2 | 4/2003 | Ahn et al. |
| 6,551,893 B1 | 4/2003 | Zheng et al. |
| 6,551,929 B1 | 4/2003 | Kori et al. |
| 6,552,383 B2 | 4/2003 | Ahn et al. |
| 6,555,875 B2 | 4/2003 | Kawasaki et al. |
| 6,558,563 B2 | 5/2003 | Kashiwaya et al. |
| 6,559,014 B1 | 5/2003 | Jeon |
| 6,566,147 B2 | 5/2003 | Basceri et al. |
| 6,570,248 B1 | 5/2003 | Ahn et al. |
| 6,586,797 B2 | 7/2003 | Forbes et al. |
| 6,592,942 B1 | 7/2003 | Van Wijck |
| 6,597,037 B1 | 7/2003 | Forbes et al. |
| 6,599,788 B1 | 7/2003 | Kawasaki et al. |
| 6,600,339 B2 | 7/2003 | Forbes et al. |
| 6,608,378 B2 | 8/2003 | Forbes et al. |
| 6,613,695 B2 * | 9/2003 | Pomarede et al. ........... 438/767 |
| 6,620,752 B2 | 9/2003 | Messing et al. |
| 6,624,013 B2 | 9/2003 | Kawasaki et al. |
| 6,632,279 B1 | 10/2003 | Ritala et al. |
| 6,638,859 B2 | 10/2003 | Sneh et al. |
| 6,642,573 B1 | 11/2003 | Halliyal et al. |
| 6,652,924 B2 | 11/2003 | Sherman |
| 6,653,657 B2 | 11/2003 | Kawasaki et al. |
| 6,660,660 B2 | 12/2003 | Haukka et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,686,212 B1 | 2/2004 | Conley, Jr. et al. |
| 6,688,951 B2 | 2/2004 | Kashiwaya et al. |
| 6,699,747 B2 | 3/2004 | Ruff et al. |
| 6,709,989 B2 | 3/2004 | Ramdani et al. |
| 6,710,538 B1 | 3/2004 | Ahn et al. |

| Patent | Kind | Date | Inventor |
|---|---|---|---|
| 6,713,812 | B1 | 3/2004 | Hoefler et al. |
| 6,720,221 | B1 | 4/2004 | Ahn et al. |
| 6,728,092 | B2 | 4/2004 | Hunt et al. |
| 6,730,163 | B2 | 5/2004 | Vaartstra |
| 6,730,164 | B2 | 5/2004 | Vaartstra et al. |
| 6,731,531 | B1 | 5/2004 | Forbes et al. |
| 6,731,590 | B1 | 5/2004 | Shingai et al. |
| 6,734,480 | B2 | 5/2004 | Chung et al. |
| 6,734,510 | B2 | 5/2004 | Forbes et al. |
| 6,737,740 | B2 | 5/2004 | Forbes et al. |
| 6,737,887 | B2 | 5/2004 | Forbes et al. |
| 6,748,959 | B1 | 6/2004 | Kashiwaya et al. |
| 6,750,126 | B1 | 6/2004 | Visokay et al. |
| 6,753,567 | B2 | 6/2004 | Maria et al. |
| 6,754,108 | B2 | 6/2004 | Forbes |
| 6,756,298 | B2 | 6/2004 | Ahn et al. |
| 6,760,257 | B2 | 7/2004 | Huang et al. |
| 6,762,081 | B2 | 7/2004 | Yamazaki et al. |
| 6,762,114 | B1 | 7/2004 | Chambers |
| 6,764,919 | B2 | 7/2004 | Yu et al. |
| 6,764,941 | B2 | 7/2004 | Yang et al. |
| 6,767,582 | B1 | 7/2004 | Elers |
| 6,767,795 | B2 | 7/2004 | Ahn et al. |
| 6,770,536 | B2 | 8/2004 | Wilk et al. |
| 6,770,923 | B2 | 8/2004 | Nguyen et al. |
| 6,774,050 | B2 | 8/2004 | Ahn et al. |
| 6,777,353 | B2 | 8/2004 | Putkonen |
| 6,778,441 | B2 | 8/2004 | Forbes et al. |
| 6,780,704 | B1 | 8/2004 | Raaijmakers et al. |
| 6,784,045 | B1 | 8/2004 | Price et al. |
| 6,784,049 | B2 | 8/2004 | Vaartstra |
| 6,784,101 | B1 * | 8/2004 | Yu et al. ............... 438/666 |
| 6,787,370 | B2 | 9/2004 | Forbes |
| 6,787,413 | B2 | 9/2004 | Ahn |
| 6,787,888 | B2 | 9/2004 | Forbes et al. |
| 6,790,791 | B2 | 9/2004 | Ahn et al. |
| 6,794,255 | B1 | 9/2004 | Forbes et al. |
| 6,794,284 | B2 | 9/2004 | Vaartstra |
| 6,794,315 | B1 | 9/2004 | Klemperer et al. |
| 6,794,709 | B2 | 9/2004 | Ahn et al. |
| 6,794,735 | B2 | 9/2004 | Forbes et al. |
| 6,800,567 | B2 | 10/2004 | Cho |
| 6,803,311 | B2 | 10/2004 | Choi |
| 6,803,326 | B2 | 10/2004 | Ahn et al. |
| 6,804,136 | B2 | 10/2004 | Forbes |
| 6,808,978 | B2 | 10/2004 | Kim |
| 6,809,370 | B1 | 10/2004 | Colombo et al. |
| 6,812,100 | B2 | 11/2004 | Ahn et al. |
| 6,812,137 | B2 | 11/2004 | Forbes et al. |
| 6,812,157 | B1 | 11/2004 | Gadgil |
| 6,812,517 | B2 | 11/2004 | Baker |
| 6,815,804 | B2 | 11/2004 | Forbes |
| 6,818,067 | B2 | 11/2004 | Doering et al. |
| 6,821,862 | B2 | 11/2004 | Cho |
| 6,821,873 | B2 | 11/2004 | Visokay et al. |
| 6,828,632 | B2 | 12/2004 | Bhattacharyya |
| 6,828,656 | B2 | 12/2004 | Forbes et al. |
| 6,831,315 | B2 | 12/2004 | Raaijmakers et al. |
| 6,833,285 | B1 | 12/2004 | Ahn et al. |
| 6,833,308 | B2 | 12/2004 | Ahn et al. |
| 6,833,317 | B2 | 12/2004 | Forbes et al. |
| 6,835,111 | B2 | 12/2004 | Ahn et al. |
| 6,844,203 | B2 | 1/2005 | Ahn et al. |
| 6,844,249 | B2 | 1/2005 | Kawasaki et al. |
| 6,844,256 | B2 | 1/2005 | Forbes et al. |
| 6,844,260 | B2 | 1/2005 | Sarigiannis et al. |
| 6,844,604 | B2 | 1/2005 | Lee et al. |
| 6,846,738 | B2 | 1/2005 | Forbes et al. |
| 6,852,613 | B2 | 2/2005 | Forbes et al. |
| 6,852,645 | B2 | 2/2005 | Colombo et al. |
| 6,858,120 | B2 | 2/2005 | Ahn et al. |
| 6,858,444 | B2 | 2/2005 | Ahn et al. |
| 6,858,865 | B2 | 2/2005 | Ahn et al. |
| 6,863,725 | B2 | 3/2005 | Vaartstra et al. |
| 6,884,706 | B2 | 4/2005 | Forbes et al. |
| 6,884,719 | B2 | 4/2005 | Chang et al. |
| 6,884,739 | B2 | 4/2005 | Ahn et al. |
| 6,888,739 | B2 | 5/2005 | Forbes |
| 6,890,843 | B2 | 5/2005 | Forbes et al. |
| 6,893,984 | B2 | 5/2005 | Ahn et al. |
| 6,900,122 | B2 | 5/2005 | Ahn et al. |
| 6,900,481 | B2 | 5/2005 | Jin et al. |
| 6,909,156 | B2 | 6/2005 | Aoyama |
| 6,914,800 | B2 | 7/2005 | Ahn et al. |
| 6,919,266 | B2 | 7/2005 | Ahn et al. |
| 6,921,702 | B2 | 7/2005 | Ahn et al. |
| 6,929,830 | B2 | 8/2005 | Tei et al. |
| 6,929,840 | B2 | 8/2005 | Hosoda et al. |
| 6,930,059 | B2 | 8/2005 | Conley, Jr. et al. |
| 6,930,346 | B2 | 8/2005 | Ahn et al. |
| 6,933,225 | B2 | 8/2005 | Werkhoven et al. |
| 6,936,508 | B2 | 8/2005 | Visokay et al. |
| 6,949,433 | B1 | 9/2005 | Hidehiko et al. |
| 6,952,032 | B2 | 10/2005 | Forbes et al. |
| 6,953,730 | B2 | 10/2005 | Ahn et al. |
| 6,955,968 | B2 | 10/2005 | Forbes et al. |
| 6,958,300 | B2 | 10/2005 | Vaartstra et al. |
| 6,958,302 | B2 | 10/2005 | Ahn et al. |
| 6,958,937 | B2 | 10/2005 | Forbes et al. |
| 6,960,538 | B2 | 11/2005 | Ahn et al. |
| 6,963,103 | B2 | 11/2005 | Forbes |
| 6,967,154 | B2 | 11/2005 | Meng et al. |
| 6,967,159 | B2 | 11/2005 | Vaartstra |
| 6,970,053 | B2 | 11/2005 | Akram et al. |
| 6,979,623 | B2 | 12/2005 | Rotondaro et al. |
| 6,979,855 | B2 | 12/2005 | Ahn et al. |
| 6,982,230 | B2 | 1/2006 | Cabral, Jr. et al. |
| 6,984,591 | B1 | 1/2006 | Buchanan et al. |
| 6,984,592 | B2 | 1/2006 | Vaartstra |
| 6,989,565 | B1 | 1/2006 | Aronowitz et al. |
| 6,989,573 | B2 | 1/2006 | Ahn et al. |
| 6,995,081 | B2 | 2/2006 | Vaartstra |
| 6,995,437 | B1 | 2/2006 | Kinoshita et al. |
| 7,012,297 | B2 | 3/2006 | Bhattacharyya |
| 7,012,311 | B2 | 3/2006 | Ohmi et al. |
| 7,014,903 | B2 | 3/2006 | Takasaki et al. |
| 7,015,534 | B2 | 3/2006 | Colombo |
| 7,018,694 | B2 | 3/2006 | Hosoda et al. |
| 7,018,695 | B2 | 3/2006 | Kakiuchi et al. |
| 7,018,868 | B1 | 3/2006 | Yang et al. |
| 7,019,351 | B2 * | 3/2006 | Eppich et al. ............... 257/303 |
| 7,026,694 | B2 | 4/2006 | Ahn et al. |
| 7,030,042 | B2 | 4/2006 | Vaartstra et al. |
| 7,037,574 | B2 | 5/2006 | Paranjpe et al. |
| 7,037,862 | B2 | 5/2006 | Ahn et al. |
| 7,041,609 | B2 | 5/2006 | Vaartstra |
| 7,042,043 | B2 | 5/2006 | Forbes et al. |
| 7,045,430 | B2 | 5/2006 | Ahn et al. |
| 7,045,431 | B2 | 5/2006 | Rotondaro et al. |
| 7,049,192 | B2 | 5/2006 | Ahn et al. |
| 7,064,058 | B2 | 6/2006 | Ahn et al. |
| 7,068,544 | B2 | 6/2006 | Forbes et al. |
| 7,071,066 | B2 | 7/2006 | Wang et al. |
| 7,074,673 | B2 | 7/2006 | Forbes |
| 7,075,829 | B2 | 7/2006 | Forbes |
| 7,077,902 | B2 | 7/2006 | Vaartstra |
| 7,081,421 | B2 | 7/2006 | Ahn et al. |
| 7,084,078 | B2 | 8/2006 | Ahn et al. |
| 7,087,481 | B2 | 8/2006 | Vaartstra et al. |
| 7,087,954 | B2 | 8/2006 | Forbes |
| 7,091,119 | B2 | 8/2006 | Colombo |
| 7,101,813 | B2 | 9/2006 | Ahn et al. |
| 7,112,485 | B2 | 9/2006 | Vaartstra |
| 7,112,841 | B2 | 9/2006 | Eldridge et al. |
| 7,115,166 | B2 | 10/2006 | Vaartstra et al. |
| 7,115,528 | B2 | 10/2006 | Vaartstra et al. |

| Patent No. | Date | Inventor(s) |
|---|---|---|
| 7,115,530 B2 | 10/2006 | Quevedo-Lopez et al. |
| 7,115,566 B2 | 10/2006 | Vaartstra et al. |
| 7,122,409 B2 | 10/2006 | Kawasaki et al. |
| 7,122,415 B2 | 10/2006 | Jang et al. |
| 7,122,464 B2 | 10/2006 | Vaartstra |
| 7,125,815 B2 | 10/2006 | Vaartstra |
| 7,129,553 B2 | 10/2006 | Ahn et al. |
| 7,135,361 B2 | 11/2006 | Visokay et al. |
| 7,135,369 B2 | 11/2006 | Ahn et al. |
| 7,135,370 B2 | 11/2006 | Baker |
| 7,135,421 B2 | 11/2006 | Ahn et al. |
| 7,135,734 B2 | 11/2006 | Eldridge et al. |
| 7,136,343 B2 | 11/2006 | Inoue et al. |
| 7,141,278 B2 | 11/2006 | Koh et al. |
| 7,141,288 B2 | 11/2006 | Inoue et al. |
| 7,141,289 B2 | 11/2006 | Inoue et al. |
| 7,144,825 B2 | 12/2006 | Adetutu et al. |
| 7,148,546 B2 | 12/2006 | Visokay et al. |
| 7,154,836 B2 | 12/2006 | Inoue et al. |
| 7,157,128 B2 | 1/2007 | Inoue et al. |
| 7,160,577 B2 | 1/2007 | Ahn et al. |
| 7,160,597 B2 | 1/2007 | Inoue et al. |
| 7,160,817 B2 | 1/2007 | Marsh |
| 7,161,894 B2 | 1/2007 | Judge |
| 7,166,347 B2 | 1/2007 | Inoue et al. |
| 7,166,886 B2 | 1/2007 | Forbes |
| 7,167,440 B2 | 1/2007 | Inoue et al. |
| 7,169,673 B2 | 1/2007 | Ahn et al. |
| 7,182,990 B2 | 2/2007 | Inoue et al. |
| 7,183,186 B2 | 2/2007 | Ahn et al. |
| 7,187,587 B2 | 3/2007 | Forbes |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,196,007 B2 | 3/2007 | Vaartstra |
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,793 B2 | 4/2007 | Bhattacharyya |
| 7,208,804 B2 | 4/2007 | Ahn et al. |
| 7,211,492 B2 | 5/2007 | Forbes et al. |
| 7,214,416 B2 | 5/2007 | Nakai et al. |
| 7,214,994 B2 | 5/2007 | Forbes et al. |
| 7,221,017 B2 | 5/2007 | Forbes et al. |
| 7,221,586 B2 | 5/2007 | Forbes et al. |
| 7,235,501 B2 | 6/2007 | Ahn et al. |
| 7,235,854 B2 | 6/2007 | Ahn et al. |
| 7,250,338 B2 | 7/2007 | Bhattacharyya |
| 7,250,367 B2 | 7/2007 | Vaartstra et al. |
| 7,253,122 B2 | 8/2007 | Vaartstra |
| 7,259,434 B2 | 8/2007 | Ahn et al. |
| 7,271,077 B2 | 9/2007 | Vaartstra et al. |
| 7,274,067 B2 | 9/2007 | Forbes |
| 7,279,413 B2 | 10/2007 | Park et al. |
| 7,279,732 B2 | 10/2007 | Meng et al. |
| 7,291,526 B2 | 11/2007 | Li |
| 7,294,556 B2 | 11/2007 | Vaartstra |
| 7,297,617 B2 | 11/2007 | Farrar et al. |
| 7,300,870 B2 | 11/2007 | Vaartstra |
| 7,301,221 B2 | 11/2007 | Farrar et al. |
| 7,309,664 B1 | 12/2007 | Marzolin et al. |
| 7,312,494 B2 | 12/2007 | Ahn et al. |
| 7,326,980 B2 | 2/2008 | Ahn et al. |
| 7,332,442 B2 | 2/2008 | Vaartstra et al. |
| 7,374,617 B2 | 3/2008 | Vaartstra |
| 7,368,402 B2 | 5/2008 | Vaartstra |
| 7,410,918 B2 | 8/2008 | Vaartstra |
| 7,432,548 B2 | 10/2008 | Forbes et al. |
| 7,439,194 B2 | 10/2008 | Kie et al. |
| 2001/0002280 A1 | 5/2001 | Sneh |
| 2001/0005625 A1 | 6/2001 | Sun et al. |
| 2001/0009695 A1 | 7/2001 | Saanila et al. |
| 2001/0014526 A1 | 8/2001 | Clevenger et al. |
| 2001/0015441 A1 | 8/2001 | Kawasaki et al. |
| 2001/0019876 A1 | 9/2001 | Juengling et al. |
| 2001/0024387 A1 | 9/2001 | Raaijmakers et al. |
| 2001/0030352 A1 | 10/2001 | Ruf et al. |
| 2001/0031332 A1 | 10/2001 | Tominaga et al. |
| 2001/0032995 A1 | 10/2001 | Maria et al. |
| 2001/0034117 A1 | 10/2001 | Eldridge et al. |
| 2001/0050438 A1 | 12/2001 | Juengling et al. |
| 2001/0052752 A1 | 12/2001 | Ghosh et al. |
| 2001/0053096 A1 | 12/2001 | Forbes et al. |
| 2001/0053577 A1 | 12/2001 | Forbes et al. |
| 2001/0054598 A1 | 12/2001 | Kashiwaya et al. |
| 2002/0001219 A1 | 1/2002 | Forbes et al. |
| 2002/0001971 A1 | 1/2002 | Cho |
| 2002/0003403 A1 | 1/2002 | Ghosh et al. |
| 2002/0004276 A1 | 1/2002 | Ahn et al. |
| 2002/0004277 A1 | 1/2002 | Ahn et al. |
| 2002/0019116 A1 | 2/2002 | Sandhu et al. |
| 2002/0019125 A1 | 2/2002 | Juengling et al. |
| 2002/0024080 A1 | 2/2002 | Derderian et al. |
| 2002/0025628 A1 | 2/2002 | Derderian et al. |
| 2002/0037603 A1 | 3/2002 | Eldridge et al. |
| 2002/0046705 A1 | 4/2002 | Sandhu et al. |
| 2002/0053869 A1 | 5/2002 | Ahn et al. |
| 2002/0068466 A1 | 6/2002 | Lee et al. |
| 2002/0072164 A1 | 6/2002 | Umotoy et al. |
| 2002/0086507 A1 | 7/2002 | Park et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0105087 A1 | 8/2002 | Forbes et al. |
| 2002/0110991 A1 | 8/2002 | Li |
| 2002/0111001 A1 | 8/2002 | Ahn |
| 2002/0117704 A1 | 8/2002 | Gonzalez |
| 2002/0121665 A1 | 9/2002 | Kawasaki et al. |
| 2002/0122885 A1 | 9/2002 | Ahn |
| 2002/0130378 A1 | 9/2002 | Forbes et al. |
| 2002/0132374 A1 | 9/2002 | Basceri et al. |
| 2002/0135048 A1 | 9/2002 | Ahn et al. |
| 2002/0145845 A1 | 10/2002 | Hunt et al. |
| 2002/0145901 A1 | 10/2002 | Forbes et al. |
| 2002/0146874 A1 | 10/2002 | Kawasaki et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167057 A1 | 11/2002 | Ahn et al. |
| 2002/0170671 A1 | 11/2002 | Matsuhita et al. |
| 2002/0175423 A1 | 11/2002 | Forbes et al. |
| 2002/0176989 A1 | 11/2002 | Knudsen et al. |
| 2002/0177244 A1 | 11/2002 | Hsu et al. |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2003/0001241 A1 | 1/2003 | Chakrabarti et al. |
| 2003/0003635 A1 | 1/2003 | Paranjpe et al. |
| 2003/0003702 A1 | 1/2003 | Ahn |
| 2003/0003722 A1 | 1/2003 | Vaartstra |
| 2003/0003730 A1 | 1/2003 | Li |
| 2003/0008235 A1 | 1/2003 | Inoue et al. |
| 2003/0008243 A1 | 1/2003 | Ahn et al. |
| 2003/0016619 A1 | 1/2003 | Judge et al. |
| 2003/0017717 A1 | 1/2003 | Ahn |
| 2003/0027360 A1 | 2/2003 | Hsu et al. |
| 2003/0040196 A1 | 2/2003 | Lim et al. |
| 2003/0043637 A1 | 3/2003 | Forbes et al. |
| 2003/0045060 A1 | 3/2003 | Ahn |
| 2003/0045078 A1 | 3/2003 | Ahn et al. |
| 2003/0049900 A1 | 3/2003 | Forbes et al. |
| 2003/0049942 A1 | 3/2003 | Haukka et al. |
| 2003/0059535 A1 | 3/2003 | Luo et al. |

| Publication No. | Date | Inventor |
|---|---|---|
| 2003/0060146 A1 | 3/2003 | Kashiwaya et al. |
| 2003/0064607 A1 | 4/2003 | Leu et al. |
| 2003/0092213 A1 | 5/2003 | Yamazaki et al. |
| 2003/0104666 A1 | 6/2003 | Bojarczuk, Jr. et al. |
| 2003/0106490 A1 | 6/2003 | Jallepally et al. |
| 2003/0111678 A1 | 6/2003 | Colombo et al. |
| 2003/0119246 A1 | 6/2003 | Ahn |
| 2003/0119291 A1 | 6/2003 | Ahn et al. |
| 2003/0132491 A1 | 7/2003 | Ahn |
| 2003/0137019 A1 | 7/2003 | Maria et al. |
| 2003/0139039 A1 | 7/2003 | Ahn et al. |
| 2003/0141560 A1 | 7/2003 | Sun |
| 2003/0142569 A1 | 7/2003 | Forbes |
| 2003/0157764 A1 | 8/2003 | Ahn et al. |
| 2003/0172872 A1 | 9/2003 | Thakur et al. |
| 2003/0173652 A1 | 9/2003 | Forbes et al. |
| 2003/0173653 A1 | 9/2003 | Forbes et al. |
| 2003/0174529 A1 | 9/2003 | Forbes et al. |
| 2003/0176025 A1 | 9/2003 | Forbes et al. |
| 2003/0176049 A1 | 9/2003 | Hegde et al. |
| 2003/0176050 A1 | 9/2003 | Forbes et al. |
| 2003/0176052 A1 | 9/2003 | Forbes et al. |
| 2003/0176053 A1 | 9/2003 | Forbes et al. |
| 2003/0185980 A1 | 10/2003 | Endo |
| 2003/0200917 A1 | 10/2003 | Vaartstra |
| 2003/0205774 A1 | 11/2003 | Hokazono |
| 2003/0207032 A1 | 11/2003 | Ahn et al. |
| 2003/0207540 A1 | 11/2003 | Ahn et al. |
| 2003/0207566 A1 | 11/2003 | Forbes et al. |
| 2003/0216038 A1 | 11/2003 | Madhukar et al. |
| 2003/0227033 A1 | 12/2003 | Ahn et al. |
| 2003/0228747 A1 | 12/2003 | Ahn et al. |
| 2003/0235134 A1 | 12/2003 | Inoue et al. |
| 2003/0235961 A1 | 12/2003 | Metzner et al. |
| 2004/0004247 A1 | 1/2004 | Forbes |
| 2004/0007171 A1 | 1/2004 | Ritala et al. |
| 2004/0009679 A1 | 1/2004 | Yeo et al. |
| 2004/0016944 A1 | 1/2004 | Ahn et al. |
| 2004/0023461 A1 | 2/2004 | Ahn et al. |
| 2004/0023516 A1 | 2/2004 | Londergan et al. |
| 2004/0027966 A1 | 2/2004 | Inoue et al. |
| 2004/0028811 A1 | 2/2004 | Cho et al. |
| 2004/0032812 A1 | 2/2004 | Inoue et al. |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0036129 A1 | 2/2004 | Forbes et al. |
| 2004/0038554 A1 | 2/2004 | Ahn |
| 2004/0040501 A1 | 3/2004 | Vaartstra |
| 2004/0041192 A1 | 3/2004 | Baker |
| 2004/0043151 A1 | 3/2004 | Vaartstra |
| 2004/0043541 A1 | 3/2004 | Ahn |
| 2004/0043569 A1 | 3/2004 | Ahn |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0070649 A1 | 4/2004 | Hess et al. |
| 2004/0092061 A1 | 5/2004 | Kawasaki et al. |
| 2004/0092073 A1 | 5/2004 | Cabral, Jr. et al. |
| 2004/0110348 A1 | 6/2004 | Ahn et al. |
| 2004/0110391 A1 | 6/2004 | Ahn et al. |
| 2004/0126944 A1 | 7/2004 | Pacheco Rotondaro et al. |
| 2004/0126954 A1 | 7/2004 | Vaartstra et al. |
| 2004/0127003 A1 | 7/2004 | Chambers |
| 2004/0135186 A1 | 7/2004 | Yamamoto |
| 2004/0140470 A1 | 7/2004 | Kawasaki et al. |
| 2004/0140513 A1 | 7/2004 | Forbes et al. |
| 2004/0144980 A1 | 7/2004 | Ahn et al. |
| 2004/0146805 A1 | 7/2004 | Kato et al. |
| 2004/0152254 A1 | 8/2004 | Vaartstra et al. |
| 2004/0157158 A1 | 8/2004 | Kakiuchi et al. |
| 2004/0161883 A1 | 8/2004 | Colombo et al. |
| 2004/0161899 A1 | 8/2004 | Luo et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0174804 A1 | 9/2004 | Kakiuchi et al. |
| 2004/0175882 A1 | 9/2004 | Ahn et al. |
| 2004/0178439 A1 | 9/2004 | Ahn et al. |
| 2004/0180171 A1 | 9/2004 | Takasaki et al. |
| 2004/0183108 A1 | 9/2004 | Ahn |
| 2004/0185630 A1 | 9/2004 | Forbes et al. |
| 2004/0185654 A1 | 9/2004 | Ahn |
| 2004/0187968 A1 | 9/2004 | Vaartstra |
| 2004/0188778 A1 | 9/2004 | Aoyama |
| 2004/0189175 A1 | 9/2004 | Ahn et al. |
| 2004/0190435 A1 | 9/2004 | Hosoda et al. |
| 2004/0191462 A1 | 9/2004 | Hosoda et al. |
| 2004/0191685 A1 | 9/2004 | Kakiuchi et al. |
| 2004/0191687 A1 | 9/2004 | Fukuzawa et al. |
| 2004/0191689 A1 | 9/2004 | Shingai et al. |
| 2004/0196620 A1 | 10/2004 | Knudsen et al. |
| 2004/0197946 A1 | 10/2004 | Vaartstra et al. |
| 2004/0198069 A1 | 10/2004 | Metzner et al. |
| 2004/0203254 A1 | 10/2004 | Conley, Jr. et al. |
| 2004/0208105 A1 | 10/2004 | Shingai et al. |
| 2004/0213124 A1 | 10/2004 | Shingai et al. |
| 2004/0214399 A1 | 10/2004 | Ahn et al. |
| 2004/0219746 A1 | 11/2004 | Vaartstra et al. |
| 2004/0219783 A1 | 11/2004 | Ahn et al. |
| 2004/0222476 A1 | 11/2004 | Ahn et al. |
| 2004/0224527 A1 | 11/2004 | Sarigiannis et al. |
| 2004/0235313 A1 | 11/2004 | Frank et al. |
| 2004/0238904 A1 | 12/2004 | Colombo et al. |
| 2004/0241581 A1 | 12/2004 | Kakiuchi et al. |
| 2004/0248387 A1 | 12/2004 | Kawasaki et al. |
| 2004/0248398 A1 | 12/2004 | Ahn et al. |
| 2004/0262700 A1 | 12/2004 | Ahn et al. |
| 2004/0264236 A1 | 12/2004 | Chae et al. |
| 2004/0266217 A1 | 12/2004 | Kim et al. |
| 2005/0006727 A1 | 1/2005 | Forbes et al. |
| 2005/0007817 A1 | 1/2005 | Forbes et al. |
| 2005/0009266 A1 | 1/2005 | Vaartstra |
| 2005/0009335 A1 | 1/2005 | Dean et al. |
| 2005/0009368 A1 | 1/2005 | Vaartstra |
| 2005/0009370 A1 | 1/2005 | Ahn |
| 2005/0017327 A1 | 1/2005 | Forbes et al. |
| 2005/0018590 A1 | 1/2005 | Inoue et al. |
| 2005/0018591 A1 | 1/2005 | Inoue et al. |
| 2005/0018592 A1 | 1/2005 | Inoue et al. |
| 2005/0019978 A1 | 1/2005 | Vaartstra et al. |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0023650 A1 | 2/2005 | Forbes et al. |
| 2005/0024092 A1 | 2/2005 | Forbes |
| 2005/0026349 A1 | 2/2005 | Forbes et al. |
| 2005/0026458 A1 | 2/2005 | Basceri et al. |
| 2005/0028733 A1 | 2/2005 | Vaartstra |

| Publication No. | Date | Inventor |
|---|---|---|
| 2005/0029545 A1 | 2/2005 | Forbes et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0034662 A1 | 2/2005 | Ahn |
| 2005/0037563 A1 | 2/2005 | Ahn |
| 2005/0047301 A1 | 3/2005 | Inoue et al. |
| 2005/0047302 A1 | 3/2005 | Inoue et al. |
| 2005/0047303 A1 | 3/2005 | Inoue et al. |
| 2005/0047304 A1 | 3/2005 | Inoue et al. |
| 2005/0047305 A1 | 3/2005 | Inoue et al. |
| 2005/0047306 A1 | 3/2005 | Inoue et al. |
| 2005/0048249 A1 | 3/2005 | Inoue et al. |
| 2005/0051828 A1 | 3/2005 | Park et al. |
| 2005/0054165 A1 | 3/2005 | Ahn et al. |
| 2005/0059198 A1 | 3/2005 | Visokay et al. |
| 2005/0070062 A1 | 3/2005 | Visokay et al. |
| 2005/0070126 A1 | 3/2005 | Senzaki |
| 2005/0077519 A1 | 4/2005 | Ahn et al. |
| 2005/0079696 A1 | 4/2005 | Colombo |
| 2005/0087134 A1 | 4/2005 | Ahn |
| 2005/0106797 A1 | 5/2005 | Colombo |
| 2005/0112499 A1 | 5/2005 | Nakai et al. |
| 2005/0124109 A1 | 6/2005 | Quevado-Lopez et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0130442 A1 | 6/2005 | Visokay et al. |
| 2005/0136589 A1 | 6/2005 | Rotondaro et al. |
| 2005/0136632 A1 | 6/2005 | Rotondaro et al. |
| 2005/0136689 A9 | 6/2005 | Vaartstra |
| 2005/0138262 A1 | 6/2005 | Forbes |
| 2005/0142324 A1 | 6/2005 | Hayashida et al. |
| 2005/0145957 A1 | 7/2005 | Ahn et al. |
| 2005/0145959 A1 | 7/2005 | Forbes |
| 2005/0151184 A1 | 7/2005 | Lee et al. |
| 2005/0157549 A1 | 7/2005 | Mokhlesi et al. |
| 2005/0160981 A9 | 7/2005 | Vaartstra |
| 2005/0164521 A1 | 7/2005 | Ahn et al. |
| 2005/0169054 A1 | 8/2005 | Forbes |
| 2005/0170208 A1 | 8/2005 | Yatsunami et al. |
| 2005/0181607 A1 | 8/2005 | Aoyama |
| 2005/0221006 A1 | 10/2005 | Vaartstra |
| 2005/0227442 A1 | 10/2005 | Ahn et al. |
| 2005/0260357 A1* | 11/2005 | Olsen et al. ............... 427/569 |
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2005/0287804 A1 | 12/2005 | Vaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0003529 A1 | 1/2006 | Baker |
| 2006/0008966 A1 | 1/2006 | Forbes et al. |
| 2006/0019033 A1 | 1/2006 | Muthukrishnan et al. |
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0033165 A1 | 2/2006 | Chan et al. |
| 2006/0043367 A1 | 3/2006 | Chang et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0054943 A1 | 3/2006 | Li et al. |
| 2006/0081895 A1* | 4/2006 | Lee et al. ............... 257/288 |
| 2006/0084247 A1 | 4/2006 | Liu |
| 2006/0110870 A1 | 5/2006 | Bhattacharyya |
| 2006/0118890 A1 | 6/2006 | Li |
| 2006/0121744 A1 | 6/2006 | Quevedo-Lopez et al. |
| 2006/0125030 A1 | 6/2006 | Ahn et al. |
| 2006/0128168 A1 | 6/2006 | Ahn et al. |
| 2006/0153051 A1 | 7/2006 | Kikukawa et al. |
| 2006/0161942 A1 | 7/2006 | Kikukawa et al. |
| 2006/0170032 A1 | 8/2006 | Bhattacharyya |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0186458 A1 | 8/2006 | Forbes et al. |
| 2006/0189154 A1 | 8/2006 | Ahn et al. |
| 2006/0205132 A1 | 9/2006 | Bhattacharyya |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0237764 A1 | 10/2006 | Ahn et al. |
| 2006/0244045 A1 | 11/2006 | Visokay et al. |
| 2006/0244082 A1 | 11/2006 | Ahn et al. |
| 2006/0244100 A1 | 11/2006 | Ahn et al. |
| 2006/0245339 A1 | 11/2006 | Fukuzawa et al. |
| 2006/0245984 A1 | 11/2006 | Kulkarni et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258097 A1 | 11/2006 | Forbes et al. |
| 2006/0258175 A1 | 11/2006 | Vaartstra et al. |
| 2006/0261376 A1 | 11/2006 | Forbes et al. |
| 2006/0261389 A1 | 11/2006 | Vaartstra |
| 2006/0261397 A1 | 11/2006 | Ahn |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0270147 A1 | 11/2006 | Ahn et al. |
| 2006/0274580 A1 | 12/2006 | Forbes |
| 2006/0275577 A1 | 12/2006 | Nakai et al. |
| 2006/0280895 A1 | 12/2006 | Kikukawa et al. |
| 2006/0280896 A1 | 12/2006 | Kikukawa et al. |
| 2006/0281330 A1 | 12/2006 | Ahn et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0027882 A1* | 2/2007 | Kulkarni ............... 707/100 |
| 2007/0030795 A1 | 2/2007 | Kikuawa et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0048926 A1 | 3/2007 | Ahn |
| 2007/0048989 A1 | 3/2007 | Ahn et al. |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059872 A1 | 3/2007 | Visokay et al. |
| 2007/0059881 A1 | 3/2007 | Ahn et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0105313 A1 | 5/2007 | Forbes |
| 2007/0107661 A1 | 5/2007 | Ahn |

| | | | |
|---|---|---|---|
| 2007/0111544 A1 | 5/2007 | Ahn | |
| 2007/0131169 A1 | 6/2007 | Ahn | |
| 2007/0134931 A1 | 6/2007 | Ahn et al. | |
| 2007/0134942 A1 | 6/2007 | Ahn et al. | |
| 2007/0141832 A1 | 6/2007 | Farrar | |
| 2007/0144438 A1 | 6/2007 | Vaartstra | |
| 2007/0145454 A1 | 6/2007 | Bhattacharyya | |
| 2007/0155190 A1 | 7/2007 | Vaartstra et al. | |
| 2007/0158765 A1 | 7/2007 | Ahn et al. | |
| 2007/0161260 A1 | 7/2007 | Vaartstra | |
| 2007/0166999 A1 | 7/2007 | Vaartstra | |
| 2007/0178643 A1 | 8/2007 | Forbes et al. | |
| 2007/0181931 A1 | 8/2007 | Ahn et al. | |
| 2007/0187772 A1 | 8/2007 | Ahn et al. | |
| 2007/0187831 A1 | 8/2007 | Ahn et al. | |
| 2007/0234949 A1 | 10/2007 | Ahn et al. | |
| 2007/0295273 A1 | 12/2007 | Vaartstra | |
| 2008/0032424 A1 | 2/2008 | Ahn et al. | |
| 2008/0064210 A1 | 3/2008 | Vaartstra | |
| 2008/0102629 A1 | 5/2008 | Vaartstra | |
| 2008/0193791 A1 | 8/2008 | Ahn et al. | |
| 2008/0217676 A1 | 9/2008 | Ahn et al. | |

OTHER PUBLICATIONS

Inumiya, Seiji, et al., "Fabrication of HfSiON gate dielectrics by plasma oxidation and nitridation, optimized for 65 nm mode low power CMOS applications", *2003 Symposium on VLSI Technology Digest of Technical Papers*, (Jun. 10-12, 2003), 17-18.

Kukli, K, et al., "Tailoring the dielectric properties of HfO2-Ta2O3 nanolaminates", *Appl. Phys. Lett.*, 68, (1996), 3737-3739.

Lee, Jack C., et al., "High-k dielectrics and MOSFET characteristics", *IEDM '03 Technical Digest. IEEE International Electron Devices Meeting, 2003*, (Dec. 8-10, 2003), 4.4.1-4.4.4.

Shanware, A., et al., "Characterization and comparison of the charge trapping in HfSiON and HfO/sub 2/ gate dielectrics", *IEEE International Electron Devices Meeting, 2003. IEDM '03 Technical Digest.*, (Dec. 8-10, 2003), 38.6.1-38.6.4.

Sneh, Ofer, "Thin film atomic layer deposition equipment for semiconductor processing", *Thin Solid Films*, 402(1-2), (Jan. 1, 2002), 248-261.

Yu, Xiongfei, et al., "High Mobility and Excellent Electrical Stability of MOSFETs Using a Novel HfTAO Gate Dielectric", *2004 Symposium on VLSI Technology Digest of Technical Papers*, (Jun. 15-17, 2004), 110-111.

Zhang, H, "High permittivity thin film nanolaminates", *Journal of Applied Physics*, 87(4), (Feb. 2000), 1921-1924.

Michaelson, Herbert B., "The work function of the elements and its periodicity", *Journal of Applied Physics*, 48(11), (Nov. 1977), 4729-4733.

Sneh, Ofer, et al., "Thin film atomic layer deposition equipment for semiconductor processing", *Thin Solid Films*, 402(1-2), (Jan. 2002), 248-261.

Tewg, J.Y., et al., "Electrical and Physical Characterization of Zirconium-Doped Tantalum Oxide Films", *Electrochemical Society Proceedings*, vol. 2002-28, (2002), 75-81.

Wilk, G. D., et al., "High-K gate dielectrics: Current status and materials properties considerations", *Journal of Applied Physics*, 89(10), (May 2001), 5243-5275.

Ahn, K Y., "ALD of Silicon Films on Germanium", U.S. Appl. No. 11/498,576, filed Aug. 3, 2006.

Ahn, et al., "ALD of Zr-Substituted BaTiO3 Films as Gate Dielectrics", U.S. Appl. No. 11/498,559, filed Aug. 3, 2006.

Ahn, K Y., "Atomic Layer Deposited Barium Strontium Titanium Oxide Films", U.S. Appl. No. 11/510,803, filed Aug. 26, 2006.

Ahn, K Y., "Atomic Layer Deposited Titanium-Doped Indium Oxide Films", U.S. Appl. No. 11/400,836, filed Apr. 7, 2006.

Ahn, K Y., "Deposition of ZrAlON Films", U.S. Appl. No. 11/498,578, filed Aug. 3, 2006.

Ahn, Kie Y., et al., "Hafnium Lanthanide Oxynitride Films", U.S. Appl. No. 11/515,143, filed Aug. 31, 2006.

Ahn, Kie Y., et al., "Lanthanide Yttrium Aluminum Oxide Dielectric Films", U.S. Appl. No. 11/297,567, filed Dec. 8, 2005.

Ahn, Kie Y., et al., "Lanthanum Aluminum Oxynitride Dielectric Films", U.S. Appl. No. 11/216,474, filed Aug. 31, 2005.

Ahn, Kie Y., et al., "Magnesium Titanium Oxide Films", U.S. Appl. No. 11/189,075, filed Jul. 25, 2005.

Ahn, Kie Y., et al., "Tantalum Lanthanide Oxynitride Films", U.S. Appl. No. 11/514,545, filed Aug. 31, 2006.

Choi, Rino, et al., "High-Quality Ultra-thin HfO2 Gate Dielectric MOSFETs with TaN Electrode and Nitridation Surface Properties", *2001 Symposium on VLSI Technology Digest of Technical Papers*, (2001), 15-16.

Forbes, "Hafnium Aluminum Oxynitride High-K Dielectric and Metal Gates", U.S. Appl. No. 11/514,558, filed Aug. 31, 2006.

Forbes, "Hafnium Tantalum Oxynitride High-K Dielectric and Metal Gates", U.S. Appl. No. 11/515,114, filed Aug. 31, 2005.

Forbes, et al., "Metal Substituted Transistor Gates", U.S. Appl. No. 11/176,738, filed Jul. 7, 2005.

Forbes, et al., "Metal-Substituted Transistor Gates", U.S. Appl. No. 11/445,000, filed Jun. 1, 2006.

Forbes, Leonard, et al., "Silicon Lanthanide Oxynitride Films", U.S. Appl. No. 11/514,533, filed Aug. 31, 2006.

Forbes, Leonard, et al., "Tantalum Silicon Oxynitride High-K Dielectrics and Metal Gates", U.S. Appl. No. 11/514,601, filed Aug. 31, 2006.

Gealy, Daniel F., et al., "Graded Dielectric Layers", U.S. Appl. No. 11/216,542, filed Aug. 30, 2005.

Gusev, E. P., et al., "Ultrathin high-K gate stacks for advanced CMOS devices", *IEEE Tech. Dig. Int. Electron Devices*, (2001),451-454.

Herman, Marian, "Atomic layer epitaxy—12 years later", *Vacuum*, vol. 42, No. 1-2, (1991),61-66.

Hoshino, Y., "Characterization and Control of the HfO2/Si(001) Interfaces", *Applied Physics Letters*, 81, (Sep. 30, 2002),2650-2652.

Iwamoto, K., "Advanced Layer-By-Layer Deposition and Annealing Process For High-Quality High-K Dielectrics Formation", *Electrochemical Society Proceedings* vol. 2003 (14), (2003),265-272.

Kim, Hyoungsub, et al., "Effects of crystallization on the electrical properties of ultrathin HfO2 dielectrics grown by atomic layer deposition", *Applied Physics Letters*, vol. 82, No. 1, (Jan. 6, 2003),106-108.

Kraus, Brenda, et al., "Conductive Nanoparticles", U.S. Appl. No. 11/197,184, filed Aug. 4, 2005.

Kukli, Kaupo, "Atomic Layer Epitaxy Growth of Tantalum Oxide Thin Films from Ta(OC2H5)5 and H2O", *J. Electrochem. Soc.*, vol. 142, No. 5, (May 1995), 1670-1675.

Lee, S. J., et al., "Performance and Reliability of Ultra Thin CVD HfO2 Gate Dielectrics with Dual Poly-Si Gate Electrodes", *2001 Symposium on VLSI Technology*, (2001),133-134.

Leskela, M., "ALD precursor chemistry: Evolution and future challenges", *J. Phys. IV France*, 9, (1999),837-852.

Nalwa, H. S., "Handbook of Thin Film Materials", *Deposition and Processing of thin Films*, vol. 1, San Diego : Academic Press,(2002),114-119.

Ritala, M., "Atomic layer deposition of oxide thin films with metal alkoxides as oxygen sources", *Science*, 288(5464), (Apr. 14, 2000),319-321.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Triyoso, D. H., et al., "Film properties of ALD HfO2 and La2O3 gate dielectrics grown on Si with various pre-deposition treatments", *J. Vac. Sci. Technol. B* 22(4), (Jul./Aug. 2004),2121-2127.

Wilk, G.D., et al., "Hafnium and zirconium silicates for advanced gate dielectrics", *Journal of Applied Physics*, 87(1), (Jan. 2000),484-492.

Ahn, Kie Y., "Magnesium-Doped Zinc Oxide Structures and Methods", U.S. Appl. No. 11/706,820, filed Feb. 13, 2007.

Ahn, Kie Y., et al., "Methods to Form Dielectric Structures in Semiconductor Devices and Resulting Devices", U.S. Appl. No. 11/581,675, filed Aug. 16, 2006.

Ahn, Kie Y., "Molybdenum-Doped Indium Oxide Structures and Methods", U.S. Appl. No. 11/706,944, filed Feb. 13, 2007.

Ahn, Kie Y., et al., "Tungsten-Doped Indium Oxide Structures and Methods", U.S. Appl. No. 11/706,498, filed Feb. 13, 2007.

Ahn, Kie Y., et al., "Zirconium-Doped Zinc Oxide Structures and Methods", U.S. Appl. No. 11/707,173, filed Feb. 13, 2007.

Alers, G. B., et al., "Intermixing at the tantalum oxide/silicon interface in gate dielectric structures", *Applied Physics Letters*, 73(11), (Sep. 14, 1998),1517-1519.

Atanassova, E., et al., "Breakdown Fields and Conduction Mechanisms in thin Ta2O5 Layers on Si for high density DRAMs", *Microelectronics Reliability*, 42,(2002), 157-173.

Colombo, D., et al., "Anhydrous Metal Nitrates as Volatile Single Source Precursors for the CVD of Metal Oxide Films", *Communications, Department of EE*, U of M, Mpls, MN, (Jul. 7, 1998),3 pages.

Conley, J. F., "Atomic Layer Deposition of Hafnium Oxide Using Anhydrous Hafnium Nitrate", *Electrochemical and Solid-State Letters*, 5(5), (May 2002),C57-C59.

Forbes, Leonard, "Memory Utilizing Oxide-Conductor Nanolaminates", U.S. Appl. No. 11/496,196, filed Jul. 31, 2006.

Forbes, et al., "Tantalum Aluminum Oxynitride High-K Dielectric and Metal Gates", U.S. Appl. No. 11/514,655, filed Aug. 31, 2006.

* cited by examiner

ATOMIC LAYER DEPOSITED HAFNIUM TANTALUM OXIDE DIELECTRICS

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET type devices. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

DETAILED DESCRIPTION

Figure 1:
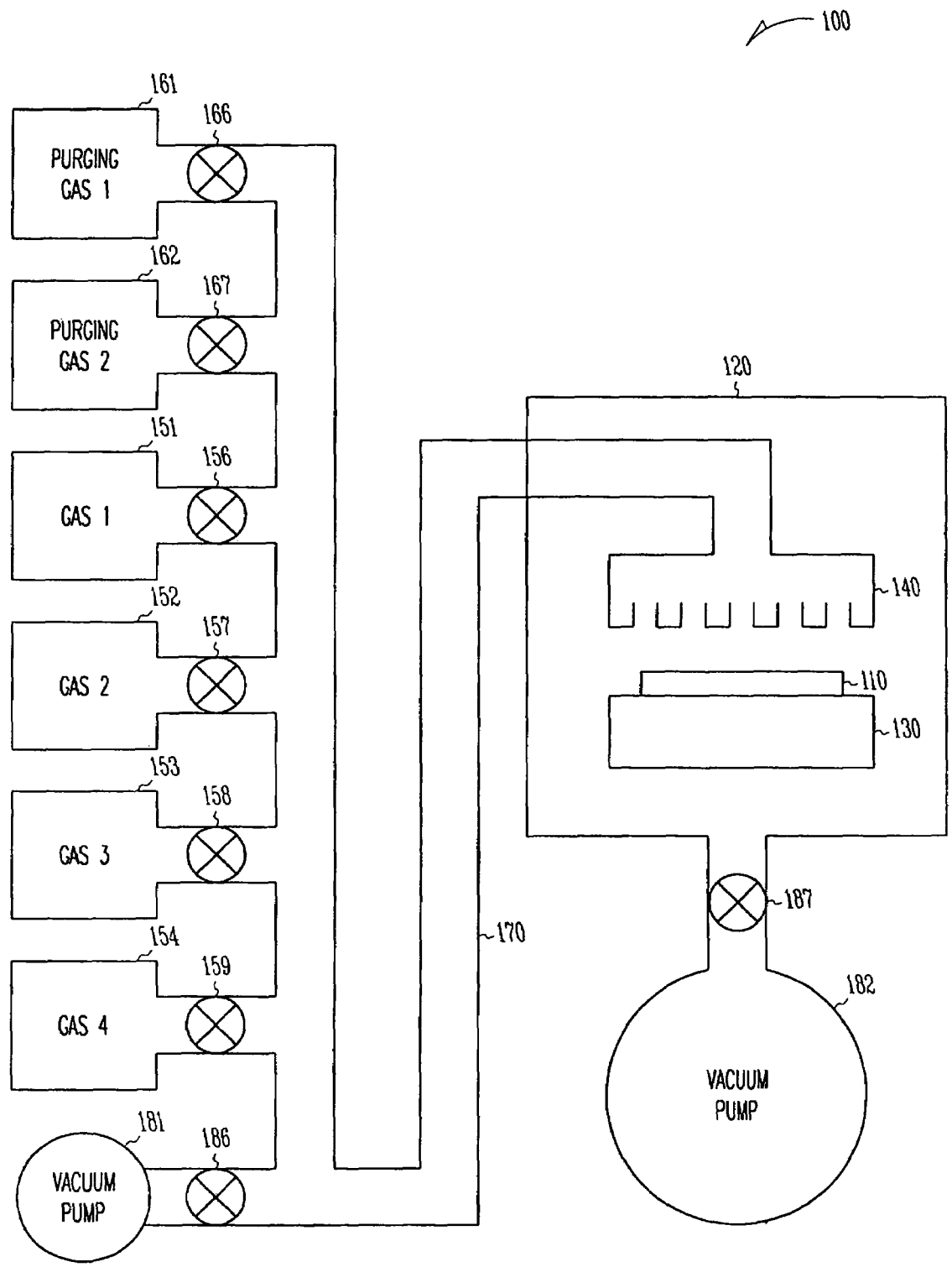
FIG. 1 depicts an atomic layer deposition system for fabricating a dielectric layer containing a hafnium tantalum oxide layer, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as in a larger or bulk layer. As a result of incomplete formation relative to a bulk structure, a thin SiO$_2$ layer of only one or two monolayers will not form a full band gap. The lack of a full band gap in a SiO$_2$ gate dielectric may cause an effective short between an underlying Si channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a $t_{eq}$ less than about 10 Å, other dielectrics than SiO$_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with SiO$_2$ having a dielectric constant $\kappa_{ox} = 3.9$, as $$t = (\kappa/\kappa_{ox})t_{eq} = (\kappa/3.9)t_{eq}.$$

Thus, materials with a dielectric constant greater than that of SiO$_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower transistor operating voltages and smaller transistor dimensions may be realized by a significant number of materials, but additional fabricating requirements makes determining a suitable replacement for SiO$_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, a small layer of SiO$_2$ may be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the SiO$_2$ thickness and a multiplicative factor of the thickness, t, of the dielectric being formed, written as $$t_{eq} = t_{SiO2} + (\kappa_{ox}/\kappa)t.$$

Thus, if a SiO$_2$ layer is formed in the process, the $t_{eq}$ is again limited by a SiO$_2$ layer. In the event that a barrier layer is formed between the silicon layer and the desired dielectric in which the barrier layer prevents the formation of a SiO$_2$ layer, the $t_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer must provide a high quality interface to maintain a high channel carrier mobility.

One of the advantages in using SiO$_2$ as a gate dielectric has been that the formation of the SiO$_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form.

Candidates to replace SiO$_2$ include high-$\kappa$ dielectric materials. High-$\kappa$ materials include materials having a dielectric constant greater than silicon dioxide, for example, dielectric materials having a dielectric constant greater than about twice the dielectric constant of silicon dioxide. Examples of such high-$\kappa$ materials include Ta$_2$O$_5$, TiO$_2$, Al$_2$O$_3$, ZrO$_2$, HfO$_2$, Y$_2$O$_3$, ZrSi$_x$O$_y$, HfSi$_x$O$_y$, HfSiON, and barium strontium titanate (BST). An appropriate high-$\kappa$ gate dielectric to replace SiO$_2$ should have a large energy gap ($E_g$) and large energy barrier heights with Si for both electrons and holes. Generally, the bandgap is inversely related to the dielectric constant for a high-$\kappa$ material, which lessens some advantages of the high-$\kappa$ material. Further, for integration into conventional CMOS processes, mobility degradation and electrical stability for high-$\kappa$ materials may need to be considered.

Other characteristics for choosing a silicon oxide replacement include using materials that provide a sharp interface with silicon that may provide a low density of interface states, a large energy barrier from the conduction band to the Fermi level of the gate electrode to maintain leakage current at acceptable levels, and structural stability with contact electrodes and substrate material during device processing steps performed after providing the dielectric layer.

Embodiments for forming a hafnium tantalum oxide film by atomic layer deposition may provide a film having a specific stoichiometry or it may be a non-stoichiometric hafnium tantalum oxide. The expression Hf$_x$Ta$_y$O$_z$ is used herein to represent a non-stoichiometric and/or a stoichiometric hafnium tantalum oxide. Embodiments of dielectric layers containing an atomic layer deposited hafnium tantalum oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

Another consideration for selecting the material and method for forming a dielectric layer for use in electronic devices and systems concerns the roughness of a dielectric layer on a substrate. Surface roughness of the dielectric layer has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a hafnium tantalum oxide dielectric layer having a substantially smooth surface relative to other processing techniques is formed using atomic layer deposition (ALD). Further, forming such a dielectric layer using atomic layer deposition can provide for controlling transitions between material layers. Thus, atomic layer deposited hafnium tantalum oxide dielectric layers can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric layers needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allow for deposition control on the order of monolayers and the ability to deposit monolayers of amorphous films.

Herein, a sequence refers to the ALD material formation based on an ALD reaction of one precursor with its reactant precursor. For example, forming tantalum oxide from a $TaCl_5$ precursor and $H_2O$, as its reactant precursor, forms an embodiment of a tantalum/oxygen sequence, which can also be referred to as a tantalum sequence. A cycle of a sequence includes pulsing a precursor, pulsing a purging gas for the precursor, pulsing a reactant precursor, and pulsing the reactant's purging gas. For an oxide compound containing two or more metals, a cycle may contain a number of sequences corresponding to each metal of the metals in the compound. However, in forming a layer of a metal species, an ALD sequence deals with reacting a precursor containing the metal species with a substrate surface. A cycle for such a metal forming sequence includes pulsing a purging gas after pulsing the precursor containing the metal species. In an embodiment, a layer of hafnium tantalum oxide is formed on a substrate mounted in a reaction chamber using ALD in repetitive tantalum sequences and hafnium sequences, using precursor gases individually pulsed into the reaction chamber. Alternately, solid or liquid precursors can be used in an appropriately designed reaction chamber.

FIG. 1 shows an embodiment of an atomic layer deposition system 100 for processing a dielectric film containing hafnium tantalum oxide. The elements depicted permit discussion of various embodiments such that those skilled in the art may practice similar embodiments without undue experimentation. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154, whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases, fewer purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases at the end of a purging sequence from the gas conduit.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. Though ALD system 100 is well suited for performing various embodiments, other commercially available ALD systems can be used.

The use, construction and fundamental operation of reaction chambers for deposition of films are understood by those of ordinary skill in the art of semiconductor fabrication. Embodiments may be practiced on a variety of such reaction chambers without undue experimentation. Furthermore, one of ordinary skill in the art will comprehend the necessary detection, measurement, and control techniques in the art of semiconductor fabrication upon studying this disclosure.

The elements of ALD system 100 can be controlled by a computer. To focus on the use of ALD system 100 in the various embodiments, the computer is not shown. Those skilled in the art can appreciate that the individual elements such as pressure control, temperature control, and gas flow within ALD system 100 can be under computer control.

Figure 2:
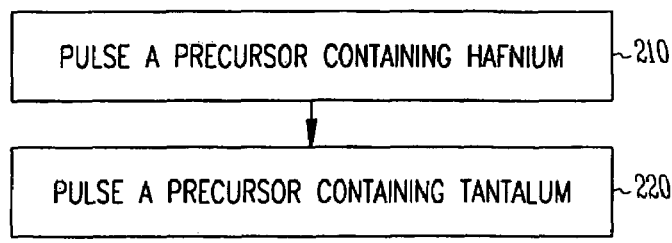
FIG. 2 illustrates a flow diagram of elements for an embodiment of a method to form a dielectric layer containing a hafnium tantalum oxide layer by atomic layer deposition.

FIG. 2 illustrates a flow diagram of elements for an embodiment of a method to form a dielectric layer containing a hafnium tantalum oxide layer using atomic layer deposition. Such a dielectric layer may be formed as a dielectric layer above a body region and below a gate of an electronic device.

At 210, in an atomic layer deposition process a precursor containing hafnium is pulsed onto a substrate surface to deposit hafnium. The precursor may be an anhydrous hafnium nitrate. Alternatively, a hafnium halide precursor, such as $HfCl_4$ or $HfI_4$, may be pulsed to deposit hafnium on the substrate surface. In addition, the pulsing of the hafnium precursor may use a pulsing period that provides uniform coverage of a monolayer on the surface or may use a pulsing period that provides partial formation of a monolayer on the surface during a hafnium sequence.

At 220, a precursor containing tantalum is pulsed. In an embodiment, a tantalum ethoxide, $Ta(OC_2H_5)_5$, may be used to deposit tantalum by atomic layer deposition. In an embodiment, a tantalum halide precursor, such as $TaCl_5$, may be used to deposit tantalum by atomic layer deposition. The tantalum may be deposited before depositing hafnium in an atomic layer deposition process for forming a hafnium tantalum oxide. In addition, the pulsing of the tantalum precursor may use a pulsing period that provides uniform coverage of a monolayer on the surface or may use a pulsing period that provides partial formation of a monolayer on the surface during a tantalum sequence.

In an embodiment, a hafnium tantalum oxide may be formed substantially as a stoichiometric hafnium tantalum oxide. In an embodiment, a hafnium tantalum oxide may be formed substantially as a non-stoichiometric hafnium tantalum oxide or a combination of non-stoichiometric hafnium tantalum oxide and stoichiometric hafnium tantalum oxide. In an embodiment, a hafnium-rich hafnium tantalum oxide made be formed by atomic layer deposition. In an embodiment, a tantalum-rich hafnium tantalum oxide made be formed by atomic layer deposition. In an embodiment, an amorphous hafnium tantalum oxide made be formed by atomic layer deposition. Alternatively, the dielectric layer may be forming containing the atomic layer deposited hafnium tantalum oxide layer and one or more layers of other dielectric materials including, but not limited to, dielectric nitrides, dielectric metal silicates, dielectric metal oxides including $Al_2O_3$, $HfO_2$, $Ta_2O_5$, and lanthanide oxides. These one or more other layers of insulating oxides may be provided in stoichiometric form, in non-stoichiometric form, or a combination of stoichiometric insulating oxides and non-stoichiometric insulating oxides.

In the various embodiments, the thickness of a $Hf_xTa_yO_z$ film is related to the number of ALD cycles performed for each metal species and the growth rate associated with the selected permutations of sequences in the cycles. As can be understood by those skilled in the art, particular effective growth rates for the engineered $Hf_xTa_yO_z$ film can be determined during normal initial testing of the ALD system for processing a hafnium tantalum oxide dielectric for a given application without undue experimentation.

Atomic layer deposition of the individual components of the hafnium tantalum oxide layer allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a hafnium tantalum oxide layer, each precursor can be pulsed into the reaction under separate environmental conditions. The substrate can be maintained at a selected temperature and the reaction chamber maintained at a selected pressure independently for pulsing each precursor. Appropriate temperatures and pressures may be maintained, whether the precursor is a single precursor or a mixture of precursors. During atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a film of hafnium tantalum oxide. Additionally, the reaction chamber can also be purged by evacuating the reaction chamber.

In various embodiments, the structure of the interface between the dielectric layer and the substrate on which it is disposed is controlled to limit the inclusion of silicon oxide, since a silicon oxide layer would reduce the effective dielectric constant of the dielectric layer. The material composition and its properties for an interface layer are typically dependent on process conditions and the condition of the substrate before forming the dielectric layer. Though the existence of an interface layer may effectively reduce the dielectric constant associated with the dielectric layer and its substrate interface layer, a silicon oxide interface layer or other composition interface layer, may improve the interface density, fixed charge density, and channel mobility of a device having this interface layer.

Figure 3:
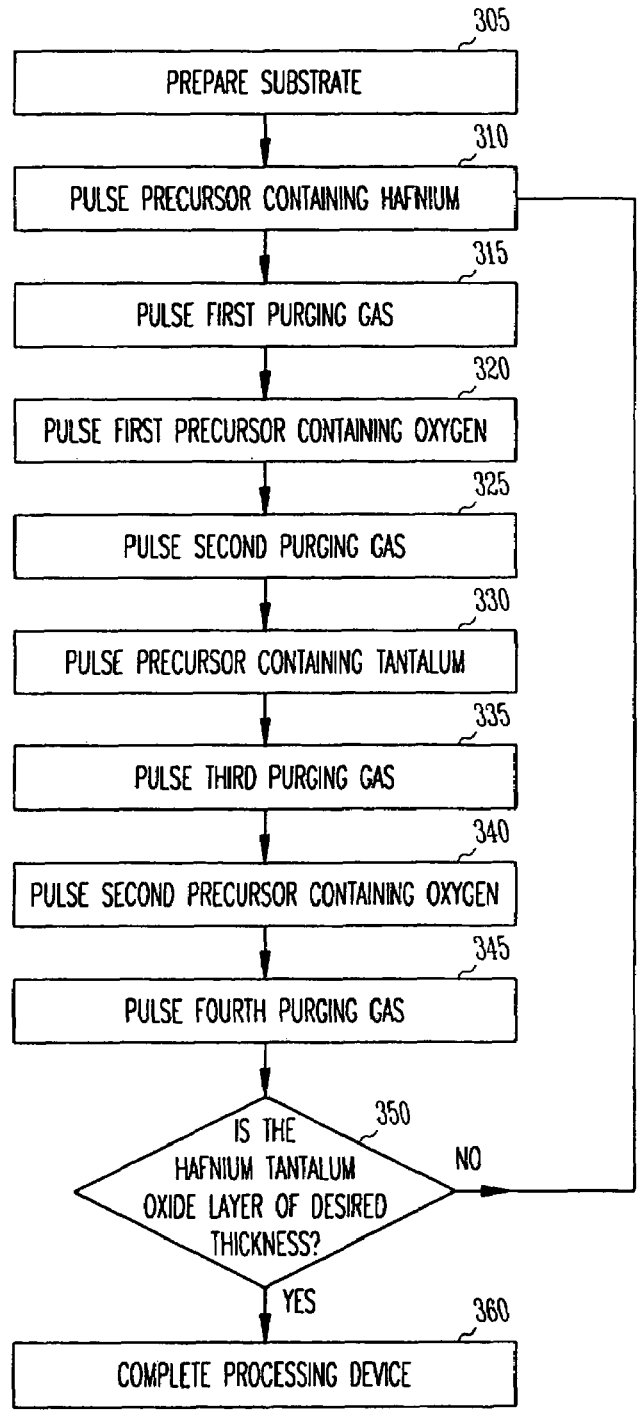
FIG. 3 illustrates a flow diagram of elements for an embodiment of a method to form a dielectric layer containing a hafnium tantalum oxide layer by atomic layer deposition.

FIG. 3 illustrates a flow diagram of elements for an embodiment of a method to form a dielectric layer containing an atomic layer deposited hafnium tantalum oxide layer. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, silicon-on-insulator, or other suitable substrates may be used. This exemplary preparation process includes cleaning substrate 110 and forming layers and regions of the substrate, such as drains and sources of a metal oxide semiconductor (MOS) transistor, prior to forming a gate dielectric. Alternatively, these active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a hafnium tantalum oxide dielectric formed using the atomic layer deposition process. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer, may improve the interface density, fixed charge density, and channel mobility of a device having this interface layer. In an embodiment, cleaning of the substrate surface may be followed by a surface nitridation at elevated temperatures in a nitrogen ambient. The nitrogen ambient may be a $NH_3$ ambient. In an embodiment, the surface nitridation is conducted at about 700° C. for about 10 seconds. Such a nitridation may be conducted after defining an active area and after a pre-gate formation cleaning.

The sequencing of the formation of the regions of the transistor being processed may follow typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 110 in its ready for processing form is conveyed into a position in reaction chamber 120 for ALD processing.

At 310, a precursor containing hafnium, such as a $Hf(NO_3)_4$ precursor, is pulsed into reaction chamber 120. The $Hf(NO_3)_4$ precursor is pulsed into reaction chamber 120 through the gas-distribution fixture 140 onto substrate 110. The flow of the $Hf(NO_3)_4$ precursor is controlled by mass-flow controller 156 from gas source 151, where the $Hf(NO_3)_4$ precursor is maintained. In an embodiment, the substrate temperature is maintained at temperature ranging from about 160° C. to about 350° C. In an embodiment, the substrate temperature is maintained at about 180° C. by heating element 130. The $Hf(NO_3)_4$ precursor reacts with the surface of the substrate 110 in the desired region defined by the unmasked areas of the substrate 110 to deposit hafnium. In other embodiments, $HfCl_4$ is used as the precursor containing hafnium.

At 315, a first purging gas is pulsed into the reaction chamber 120. In an embodiment, nitrogen is used as a purging gas and a carrier gas. The nitrogen flow is controlled by mass-flow controller 166 from the purging gas source 161 into the gas conduit 170. Using the pure nitrogen purge avoids overlap of the precursor pulses and possible gas phase reactions. In an embodiment, argon gas or other inert gas may be used as the purging gas. Following the purge, a first oxygen-containing precursor is pulsed into the reaction chamber 120, at 320.

For a hafnium sequence using a $Hf(NO_3)_4$ precursor or a $HfCl_4$ precursor, water vapor may be selected as the precursor acting as a reactant to deposit hafnium and oxygen on the substrate 110. The $H_2O$ vapor is pulsed into the reaction chamber 120 through gas conduit 170 from gas source 152 by mass-flow controller 157. The water vapor aggressively reacts at the surface of substrate 110.

Following the pulsing of the first oxygen-containing precursor, a second purging gas is injected into the reaction chamber 120, at 325. Nitrogen gas may be used to purge the reaction chamber after pulsing each precursor gas in the hafnium/oxygen sequence. In an embodiment, argon gas or other inert gas may be used as the purging gas. Excess precursor gas and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 330, a precursor containing tantalum is pulsed into reaction chamber 120. In an embodiment, a tantalum ethoxide precursor is used. The $Ta(OC_2H_5)_5$ is pulsed to the surface of the substrate 110 through gas-distribution fixture 140 from gas source 153 by mass-flow controller 158. The $Ta(OC_2H_5)_5$ is introduced onto the hafnium and oxygen formed during the hafnium sequence. In an embodiment, during pulsing of the precursor containing tantalum, the substrate may be held between about 250° C. and about 350° C. by the heating element 130. In an embodiment, a tantalum halide may be used as a precursor.

At 335, a third purging gas is introduced into the system. In an embodiment, nitrogen may be used as a purging and carrier gas. Alternatively, purified argon may be used as a purging gas. The flow of the third purging gas is controlled by mass-flow controller 167 from the purging gas source 162 into the gas conduit 170 and subsequently into the reaction chamber 120.

At 340, a second oxygen-containing precursor is pulsed into the reaction chamber 120. Water vapor may be used as the precursor acting as an oxidizing reactant to interact at the substrate 110. The water vapor is pulsed into the reaction chamber 120 through gas conduit 170 from gas source 154 by mass-flow controller 159. The water vapor aggressively reacts at the surface of substrate 110 to form a hafnium tantalum oxide.

At 345, a fourth purging gas is injected into the reaction chamber 120. In an embodiment, nitrogen gas is used as the fourth purging gas to purge the reaction chamber. Alternatively, argon gas may be used as the fourth purging gas. Excess precursor gas and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 350, it is determined whether the hafnium tantalum oxide film is of the desired thickness, t. The thickness of a hafnium tantalum oxide film after one cycle is determined by the pulsing periods used in the tantalum sequence and the hafnium sequence at a given temperature. Typically, at a given temperature, the pulsing periods can vary over a significant range above some minimum pulse time for the precursors, without substantially altering the growth rate. Once a set of periods for one cycle is determined, the growth rate for the hafnium tantalum oxide film will be set at a value such as N nm/cycle. For a desired hafnium tantalum oxide film thickness in an application such as forming a gate dielectric of a MOS transistor, the ALD process should be repeated for t/N cycles. The desired thickness should be completed after t/N cycles. If less than t/N cycles have been completed, the process starts over at 310 with the pulsing of the precursor containing tantalum. If t/N cycles have completed, no further ALD processing is required and the hafnium tantalum oxide film is completed. Once the total number of cycles to form the desired thickness has been completed, the dielectric film containing the hafnium tantalum oxide layer may optionally be annealed. In an embodiment, completion of a desired composition of the dielectric layer is followed by annealing in a nitrogen ambient. The annealing may be performed at about 950° C. for approximately 30 seconds. The $Hf_xTa_yO_z$ layer may be amorphous after annealing.

At 360, after forming the hafnium tantalum oxide layer, processing the device having the dielectric layer containing the hafnium tantalum oxide layer is completed. In an embodiment, completing the device includes further processing of the dielectric layer to include layers of other dielectric materials. In an embodiment, completing the device includes completing the formation of a transistor. In another embodiment, completing the device includes completing the formation of a capacitor. Alternatively, completing the process includes completing the construction of a memory device having an array with access transistors formed with gate dielectrics containing an atomic layer deposited hafnium tantalum oxide layer. Further, in another embodiment, completing the process includes the formation of an electronic system including an information handling device that uses electronic devices with transistors formed with dielectric films containing an atomic layer deposited hafnium tantalum oxide layer.

Embodiments for methods similar to the embodiment of FIG. 3 may include numerous permutations for forming the hafnium tantalum oxide layer. In an embodiment, the tantalum sequence is conducted before the hafnium sequence. A hafnium/tantalum cycle may include a number, x, of tantalum sequences and a number, y, of hafnium sequences. The number of sequences x, y may be selected to engineer the relative amounts of tantalum to hafnium. In an embodiment, the number of sequences x and y, along with associated pulsing periods and times, is selected to form a hafnium tantalum oxide with substantially equal amounts of tantalum and hafnium. In an embodiment, the number of sequences is selected with x=y. In an embodiment, the number of sequences x and y are selected to form a tantalum-rich hafnium tantalum oxide. Alternatively, the number of sequences x and y are selected to form a hafnium-rich hafnium tantalum oxide. In an embodiment, tantalum makes up about 43% of the hafnium tantalum oxide. The dielectric may be formed as $HfO_2$ doped with $Ta_2O_5$. In an embodiment, one or more sequences of depositing tantalum metal and one or more sequences of depositing hafnium metal are conducted before introducing a reactant precursor to oxidize the tantalum and hafnium. In an embodiment using metal depositing sequences, a mixture of tantalum and hafnium may be provided on the substrate surface that is oxidized when the reactant oxidizing precursor is introduced to the substrate surface. In an embodiment, an amorphous hafnium tantalum oxide layer is formed.

In an embodiment, the hafnium tantalum oxide layer may be doped with zirconium or a lanthanide. The doping may be employed to enhance the leakage current characteristics of the dielectric layer containing the hafnium tantalum oxide by providing a disruption or perturbation of the hafnium tantalum oxide structure. Such doping may be realized by substituting a sequence of a dopant for a tantalum sequence or a hafnium sequence. The choice for substitution may depend on the form of the hafnium tantalum oxide structure with respect to the ratio of tantalum atoms to hafnium desired in the oxide. To maintain a substantially hafnium tantalum oxide, the amount of dopant inserted into the oxide may be limited to a relatively small fraction of the total number of tantalum and hafnium atoms. Such a fraction may be 10 percent or less. In an embodiment, to maintain a substantially hafnium tantalum oxide, the amount of dopant in the oxide may be limited to a relatively small fraction of the tantalum or the hafnium atoms based on which material is selected to have the smallest number of atoms. Such a fraction may be 10 percent or less.

Various embodiments for fabricating a hafnium tantalum oxide may provide a hafnium tantalum oxide that is amorphous. However, crystallization of an atomic layer deposited hafnium tantalum oxide may occur above 1000° C. Embodiments for ALD formation of a hafnium tantalum oxide layer may fabricate an electrically stable device containing this oxide layer with limited mobility degradation, in a process that provides reduced complexity.

Embodiments providing a hafnium tantalum oxide layer between a gate and a body region over which the gate is formed allows for the use of thin dielectrics in electronic devices. Such a thin dielectric may be disposed between a floating gate and a control gate above a body region in an electronic device. Dielectrics containing a hafnium tantalum oxide layer may be provided with a thickness less than 50 Å. Embodiments may include dielectrics having a thickness less than 30 Å. Further, the embodiments described herein provide a process for growing a hafnium tantalum oxide layer having a wide range of useful equivalent oxide thickness, $t_{eq}$, associated with a dielectric constant in the range from about 16 to about 26. This range of dielectric constants provides for a $t_{eq}$ ranging from about 15% to about 25% relative to a given silicon dioxide thickness. In an embodiment, a dielectric layer containing a hafnium tantalum oxide layer has a $t_{eq}$ ranging from about 4 Å to about 30 Å. In an embodiment, a dielectric layer containing a hafnium tantalum oxide layer has a $t_{eq}$ of less than 5 Å.

Dielectric films employing a hafnium tantalum oxide layer as a replacement for a silicon oxide layer have useful characteristics in comparison with other metal oxides such as hafnium oxide. Hafnium tantalum oxide layers may be formed without an appreciable flat band voltage shift. MOS capacitors using a hafnium tantalum oxide dielectric may provide improved hysteresis characteristics as compared to $HfO_2$. In addition, a $Hf_xTa_yO_z$ layer may provide a reduction in interface states density ($D_{it}$) compared to $HfO_2$, where the tantalum aids in suppressing interface traps associated with $HfO_2$. For example, a $Hf_xTa_yO_z$ layer having a Ta concentration of about 43% may yield a $D_{it}$ that may be a factor of ten lower than that of hafnium oxide. Another useful characteristic associated with employing hafnium tantalum oxide as compared to hafnium oxide is a higher electron mobility in n-channel MOSFETs (NMOSFETs) using the hafnium tantalum oxide. Hafnium tantalum oxide layers used in a transistor provide higher drain current and smaller sub-threshold swing as compared to a transistor using a hafnium oxide layer. Under a 1000 second stress, a shift in threshold voltage may be about 6.2 mV, which is about a factor of twenty lower than that of pure hafnium dioxide. A transistor structure using a hafnium tantalum oxide layer may be operated without an appreciable sub-threshold voltage swing or variations in transconductance compared to such a structure using a hafnium oxide layer under similar voltage stress. Additionally, a hafnium tantalum oxide may provide improved lifetime characteristics over a hafnium oxide. The relative improvement over a hafnium oxide may depend on tantalum concentration. For example, a 10-year lifetime operating voltage of a hafnium tantalum oxide using about 43% tantalum projects to about 2.58 V, while the operating voltage of a hafnium tantalum oxide using about 29% tantalum projects to about 2.47 V, both of which are higher operating voltages than a projected voltage of 1.3V for $HfO_2$.

It can appreciated by those skilled in the art that the elements of a method for forming an atomic layer deposited hafnium tantalum oxide film in the embodiment of FIG. 3 can be performed with various numbers of tantalum sequences relative to the number of hafnium sequences. In selecting the number of tantalum sequences and hafnium sequences relative to each other, a hafnium tantalum oxide film can be engineered with bandgap and dielectric constant characteristics ranging from that of $HfO_2$ to that of $Ta_2O_5$ for a thin dielectric layer. In various embodiments, a dielectric layer of hafnium tantalum oxide is provided with a controlled interface between the dielectric layer and a substrate surface on which it is disposed. The selection of the ratio of tantalum to hafnium in the hafnium tantalum layer may be conducted in a trade-off process with improving the current leakage characteristics of the film. Additionally, the novel process can be implemented to form transistors, capacitors, memory devices, and other electronic systems including information handling devices.

Figure 4:
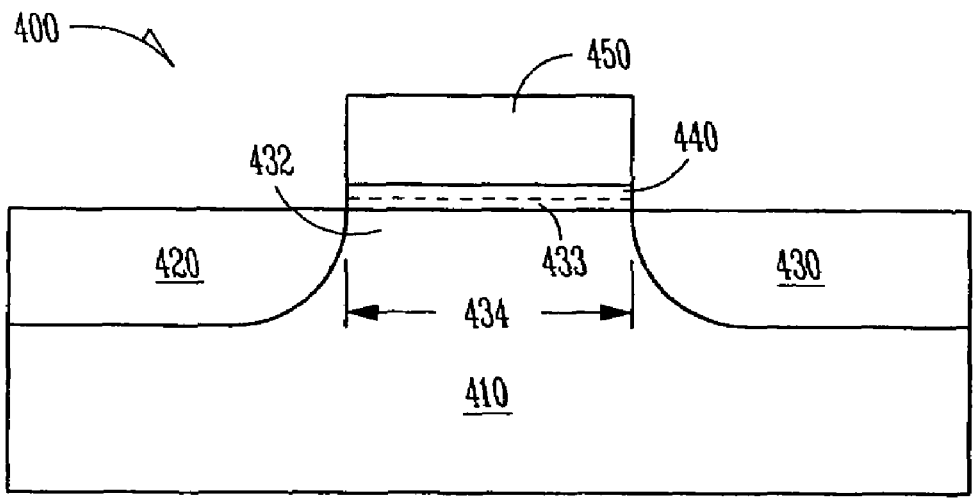
FIG. 4 shows an embodiment of a configuration of a transistor having a dielectric layer containing an atomic layer deposited hafnium tantalum oxide layer.

A transistor 400 as depicted in FIG. 4 may be constructed by forming a source region 420 and a drain region 430 in a silicon based substrate 410 where source and drain regions 420, 430 are separated by a body region 432. Body region 432 defines a channel having a channel length 434. A dielectric layer is disposed on substrate 410. A gate 450 is formed over and contacts gate dielectric 440. The dielectric is formed on substrate 410. The resulting dielectric layer forms gate dielectric 440. Gate dielectric 440 may be realized as a dielectric layer formed substantially of a hafnium tantalum oxide film. Gate dielectric 440 may be a dielectric layer containing one or more layers of dielectric material in which at least one layer is hafnium tantalum oxide film.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. Forming the substrate, gate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 440 may be realized as a gate insulator in a silicon CMOS transistor. Use of such a gate dielectric including an atomic layer deposited hafnium tantalum oxide layer is not limited to silicon based substrates, but may be used with a variety of semiconductor substrates.

Figure 5:
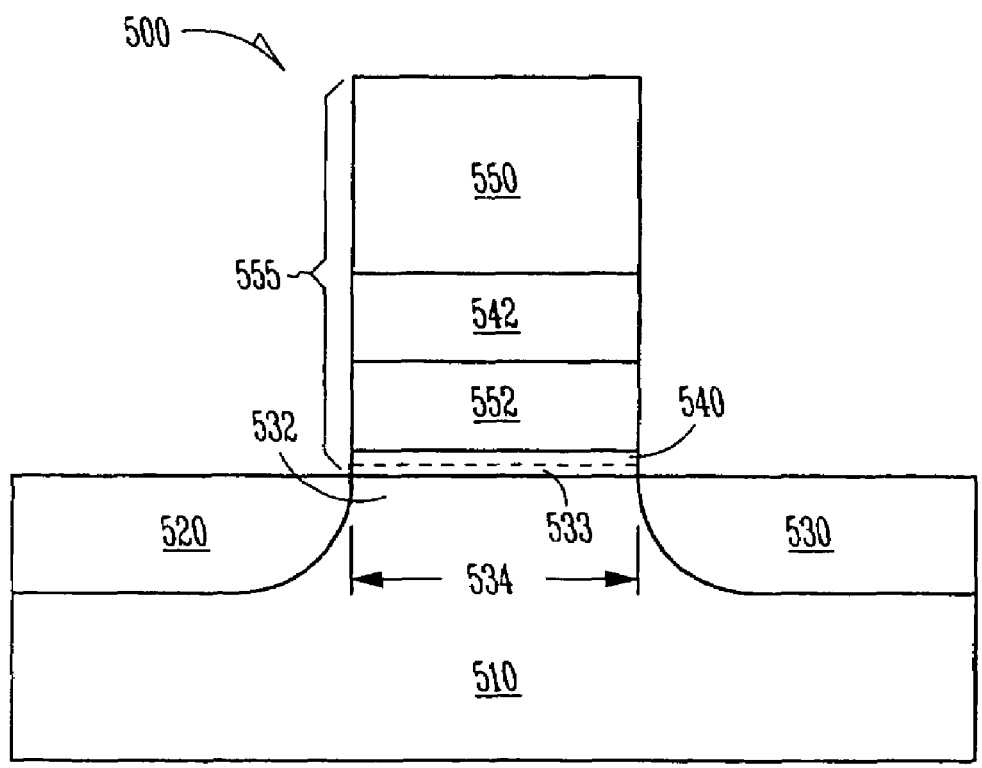
FIG. 5 shows an embodiment of a configuration of a floating gate transistor having a dielectric layer containing an atomic layer deposited hafnium tantalum oxide layer.

FIG. 5 shows an embodiment of a configuration of a floating gate transistor 500 having a hafnium tantalum oxide layer. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. In an embodiment, floating gate 552 is formed over and contacts gate dielectric 540. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated.

Gate dielectric 540 includes a dielectric containing an atomic layer deposited hafnium tantalum oxide layer formed in embodiments similar to those described herein. Gate dielectric 540 may be realized as a dielectric layer formed substantially of hafnium tantalum oxide. Gate dielectric 540 may include multiple layers in which at least one layer is substantially hafnium tantalum oxide. In an embodiment, gate dielectric 540 may include multiple layers where a substantially hafnium tantalum oxide contacts body region 532.

In an embodiment, floating gate dielectric 542 includes a dielectric layer having an atomic layer deposited hafnium tantalum oxide layer formed in embodiments similar to those described herein. Floating gate dielectric 542 may be realized as a dielectric layer formed substantially of hafnium tantalum oxide. Floating gate dielectric 542 may include multiple layers in which at least one layer is substantially hafnium tantalum oxide. In an embodiment, control gate 550 is formed over and contacts floating gate dielectric 542.

Alternately, both gate dielectric 540 and floating gate dielectric 542 may be formed as dielectric layers including an atomic layer deposited hafnium tantalum oxide layer. Gate dielectric 540 and floating gate dielectric 542 may be realized by embodiments similar to those described herein with the remaining elements of the transistor 500 formed using processes known to those skilled in the art.

In an embodiment, gate dielectric 540 forms a tunnel gate insulator and floating gate dielectric 542 forms an inter-gate insulator in flash memory devices, where gate dielectric 540 and/or floating gate dielectric 542 include a hafnium tantalum oxide layer formed by atomic layer deposition. Use of dielectric layers configured in various embodiments is not limited to silicon based substrates, but may be used with a variety of semiconductor substrates.

Figure 6:
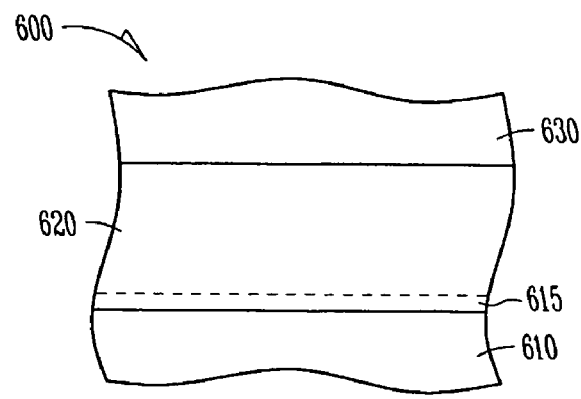
FIG. 6 shows an embodiment of a configuration of a capacitor having a dielectric layer containing an atomic layer deposited hafnium tantalum oxide layer.

The embodiments of methods for forming dielectric layers containing a hafnium tantalum oxide layer by atomic layer deposition may also be applied to forming capacitors in various integrated circuits, memory devices, and electronic systems. Such capacitors may be formed in addition to forming a transistor having a gate dielectric and/or an inter-gate dielectric containing an atomic layer deposited hafnium tantalum oxide layer. In an embodiment for forming a capacitor 600 illustrated in FIG. 6, a method includes forming a first conductive layer 610, forming a dielectric layer 620 containing a hafnium tantalum oxide layer formed by atomic layer deposition on first conductive layer 610, and forming a second conductive layer 630 on dielectric layer 620. Dielectric layer 620 including a hafnium tantalum oxide layer may be formed using any of the embodiments described herein.

An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated.

Dielectric layer 620 may be realized as a dielectric layer formed substantially of hafnium tantalum oxide. Dielectric layer 620 may include multiple layers in which at least one layer is substantially hafnium tantalum oxide. In an embodiment, dielectric layer 620 may include multiple layers where a substantially hafnium tantalum oxide film contacts first conductive layer 610. Embodiments for dielectric layer 620 in a capacitor include, but are not limited to, dielectrics in DRAM capacitors and dielectrics in capacitors in analog, radio frequency (RF), and mixed signal integrated circuits.

Various embodiments for a dielectric film containing a hafnium tantalum oxide layer formed by atomic layer deposition may provide for enhanced device performance by providing devices with reduced leakage current. In an embodiment, such improvements in leakage current characteristics may be attained by forming one or more layers of an atomic layer deposited hafnium tantalum oxide in a nanolaminate structure with other dielectric layers including other metal oxides such as tantalum oxide and/or hafnium oxide. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers may be alternating layers of materials of the composite film. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a $TaO_x/Hf_xTa_yO_z$ nanolaminate contains layers of a tantalum oxide and a hafnium tantalum oxide. In an embodiment, a $HfO_x/Hf_xTa_yO_z$ nanolaminate contains layers of a hafnium oxide and a hafnium tantalum oxide. A $TaO_x/Hf_xTa_yO_z/HfO_x$ nanolaminate contains layers of tantalum oxide, hafnium oxide, and hafnium tantalum oxide.

Figure 7:
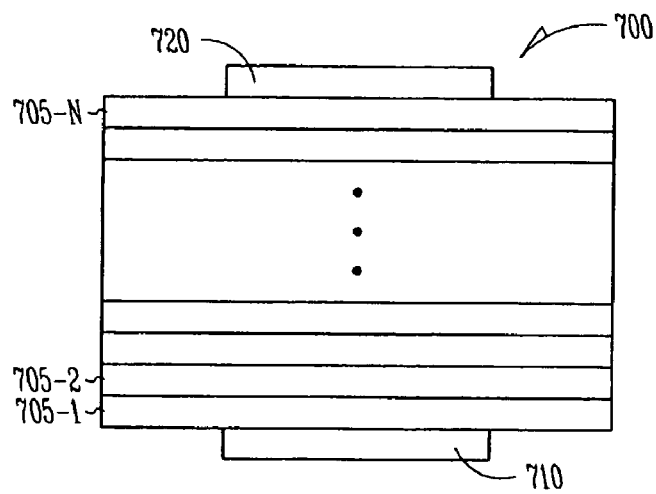
FIG. 7 depicts an embodiment of a dielectric layer including a nanolaminate having at least one layer containing an atomic layer deposited hafnium tantalum oxide layer.

FIG. 7 depicts a nanolaminate structure 700 for an embodiment of a dielectric structure including an atomic layer deposited hafnium tantalum oxide layer. In an embodiment, nanolaminate structure 700 includes a plurality of layers 705-1, 705-2 to 705-N, where at least one layer contains a hafnium tantalum oxide film formed according to an embodiment herein. The other layers may be other dielectric layers or dielectric metal oxides. The sequencing of the layers depends on the application. In an embodiment, an atomic layer deposited hafnium tantalum oxide film is the first layer formed on a substrate. In an embodiment, nanolaminate structure 700 contains an atomic layer deposited hafnium tantalum oxide film in contact with conductive contact 710 and/or conductive contact 720. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant. Embodiments for structures such as nanolaminate structure 700 may be used as nanolaminate dielectrics in NROM flash memory devices as well as other integrated circuits.

Transistors, capacitors, and other devices having dielectric films containing a hafnium tantalum oxide layer formed by atomic layer deposition by various embodiments similar to the methods described herein may be implemented into memory devices and electronic systems including information handling devices. Embodiments of these information handling devices may include wireless systems, telecommunication systems, and computers. Further, embodiments of electronic devices having dielectric films containing an atomic layer deposited hafnium tantalum oxide film may be realized as integrated circuits.

Figure 8:
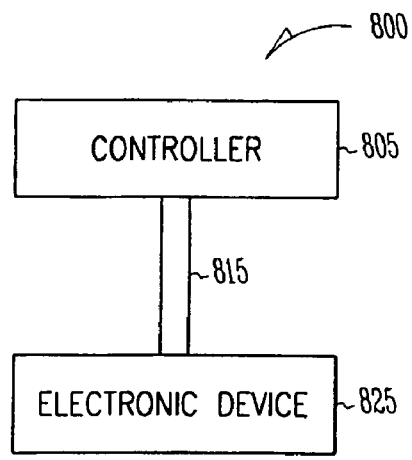
FIG. 8 is a simplified diagram for an embodiment of a controller coupled to an electronic device, in which at least one of the two includes a dielectric layer containing an atomic layer deposited hafnium tantalum oxide layer.

FIG. 8 illustrates a diagram for an electronic system 800 having one or more devices having a dielectric layer containing an atomic layer deposited hafnium tantalum oxide layer fabricated according to various embodiments. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer containing an atomic layer deposited hafnium tantalum oxide layer. Electronic system 800 may include, but is not limited to, information handling devices, wireless systems, telecommunication systems, fiber optic systems, electro-optic systems, and computers.

Figure 9:
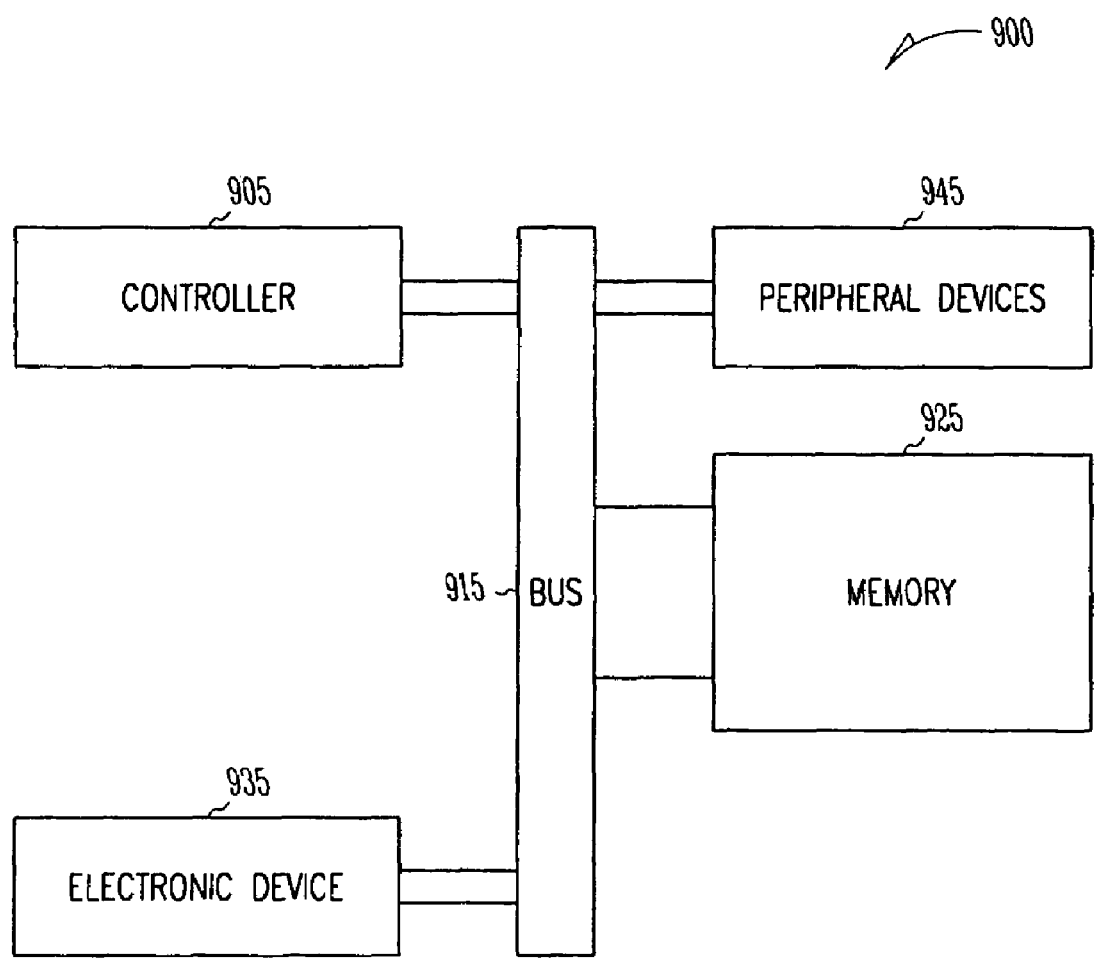
FIG. 9 illustrates a diagram for an embodiment of an electronic system having devices with a dielectric film containing an atomic layer deposited hafnium tantalum oxide layer.

FIG. 9 depicts a diagram of an embodiment of a system 900 having a controller 905 and a memory 925. Controller 905 and/or memory 925 may include a dielectric layer containing an atomic layer deposited hafnium tantalum oxide layer according to various embodiments. System 900 also includes an electronic device 935 and a bus 915, where bus 915 provides electrical conductivity between controller 905 and electronic device 935, and between controller 905 and memory 925. Bus 915 may include an address, a data bus, and a control bus, each independently configured. Alternately, bus 915 may use common conductive lines for providing address, data, and/or control, the use of which is regulated by controller 905. In an embodiment, electronic device 935 may be additional memory configured in a similar manner as memory 925. An embodiment may include an additional peripheral device or devices 945 coupled to bus 915. In an embodiment, controller 905 is a processor. Any of controller 905, memory 925, bus 915, electronic device 935, and peripheral devices 945 may include a dielectric layer containing an atomic layer deposited hafnium tantalum oxide layer formed according to various embodiments. System 900 may include, but is not limited to, information handling devices, telecommunication systems, and computers.

Peripheral devices 945 may include displays, additional storage memory, or other control devices that may operate in conjunction with controller 905. Alternately, peripheral devices 945 may include displays, additional storage memory, or other control devices that may operate in conjunction with controller 905 and/or memory 925.

Memory 925 may be realized as a memory device containing a dielectric layer containing an atomic layer deposited hafnium tantalum oxide layer formed according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of a dielectric layer containing an atomic layer deposited hafnium tantalum oxide layer may be amorphous and possess smooth surfaces. Such hafnium tantalum oxide films may provide enhanced electrical properties due to their smoother surface resulting in reduced leakage current. Additionally, such dielectric layers provide a significantly thicker physical thickness than a silicon oxide layer having the same equivalent oxide thickness, where the increased thickness would also reduce leakage current. These properties of embodiments of dielectric layers allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films including a dielectric layer containing an atomic layer deposited hafnium tantalum oxide layer are formed having a dielectric constant ($\kappa$) substantially higher than that of silicon oxide. These dielectric films are capable of a $t_{eq}$ thinner than $SiO_2$ gate dielectrics of the same physical thickness. Alternately, the high dielectric constant relative to silicon dioxide allows the use of much larger physical thickness of these high-$\kappa$ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method comprising:
   forming a source region and a drain region separated by a body region;
   forming a gate; and
   forming a dielectric layer above the body region and below the gate, the dielectric layer containing a hafnium tantalum oxide layer, the hafnium tantalum oxide being a bimetal oxide, the hafnium tantalum oxide layer formed as one or more monolayers by a layer-by-layer process having a plurality of cycles, each cycle including:
   introducing a precursor containing hafnium to a substrate; and
   introducing a precursor containing tantalum to the substrate such that a purging process is performed between introducing the precursor containing hafnium and introducing the precursor containing tantalum, wherein introducing each precursor is performed at a pressure, a substrate temperature, and pulsing parameters selected individually for each precursor to form hafnium titanium oxide in the cycle.

2. The method of claim 1, wherein forming the gate includes forming the gate as a control gate, and forming the dielectric layer includes forming the dielectric layer as an inter-gate dielectric below the control gate and above a floating gate.

3. The method of claim 1, wherein introducing a precursor containing hafnium includes pulsing a hafnium nitrate precursor.

4. The method of claim 1, wherein the method includes annealing the dielectric layer after forming the hafnium tantalum oxide layer.

5. The method of claim 1, wherein the method includes conducting a surface nitridation in a nitrogen based ambient before forming the dielectric layer.

6. The method of claim 1, wherein the method is a method of forming an integrated circuit including forming the dielectric layer as a gate insulator of a transistor in the integrated circuit.

7. The method of claim 1, wherein the method is a method of forming an integrated circuit including forming the dielectric layer as a gate insulator in a CMOS transistor in the integrated circuit.

8. The method of claim 1, wherein forming the dielectric layer includes forming the dielectric layer as a nanolaminate having the hafnium tantalum oxide layer.

9. The method of claim 8, wherein forming the dielectric layer includes forming a tantalum oxide layer as a layer of the nanolaminate.

10. The method of claim 8, wherein forming the dielectric layer includes forming a hafnium oxide layer as a layer of the nanolaminate.

11. The method of claim 1, wherein the method is a method of forming an integrated circuit on a silicon-on-insulator substrate.

12. The method of claim 1, wherein the method includes forming a capacitor containing a second hafnium tantalum oxide layer and forming the second hafnium tantalum oxide layer by atomic layer deposition.

13. The method of claim 1, wherein the method is a method of forming a memory device.

14. The method of claim 1, wherein the method is a method of forming an electronic system.

15. A method comprising:
   forming a source region and a drain region separated by a body region;
   forming a gate; and
   forming a dielectric layer above the body region and below the gate, the dielectric layer containing a hafnium tantalum oxide layer, the hafnium tantalum oxide layer formed as one or more monolayers by a process including:
   introducing a precursor containing hafnium to a substrate; and introducing a precursor containing tantalum to the substrate, wherein introducing the precursor containing tantalum includes pulsing a tantalum ethoxide precursor.

16. A method comprising:
forming a source region and a drain region separated by a body region;
forming a gate; and
forming a dielectric layer above the body region and below the gate, the dielectric layer containing a hafnium tantalum oxide layer, the hafnium tantalum oxide layer formed as one or more monolayers by a process including:
introducing a precursor containing hafnium to a substrate; and
introducing a precursor containing tantalum to the substrate, and forming a capacitor containing a second hafnium tantalum oxide layer and forming the second hafnium tantalum oxide layer by atomic layer deposition, wherein forming the capacitor containing the second hafnium tantalum oxide layer includes forming the second hafnium tantalum oxide layer of the capacitor in an analog integrated circuit.

17. A method comprising:
forming a source region and a drain region separated by a body region;
forming a gate; and
forming a dielectric layer above the body region and below the gate, the dielectric layer containing a hafnium tantalum oxide layer, the hafnium tantalum oxide layer formed as one or more monolayers by a process including:
introducing a precursor containing hafnium to a substrate; and
introducing a precursor containing tantalum to the substrate, and
forming a capacitor containing a second hafnium tantalum oxide layer and forming the second hafnium tantalum oxide layer by atomic layer deposition, wherein forming the capacitor containing the second hafnium tantalum oxide layer includes forming the second hafnium tantalum oxide layer of the capacitor in a radio frequency integrated circuit.

18. A method comprising:
forming a source region and a drain region separated by a body region;
forming a gate; and
forming a dielectric layer above the body region and below the gate, the dielectric layer containing a hafnium tantalum oxide layer, the hafnium tantalum oxide layer formed as one or more monolayers by a process including:
introducing a precursor containing hafnium to a substrate; and
introducing a precursor containing tantalum to the substrate, and
forming a capacitor containing a second hafnium tantalum oxide layer and forming the second hafnium tantalum oxide layer by atomic layer deposition, wherein forming the capacitor containing the second hafnium tantalum oxide layer includes forming the second hafnium tantalum oxide layer of the capacitor in a mixed signal integrated circuit.

19. A method comprising:
forming a memory array in a substrate including:
forming a source region and a drain region separated by a body region;
forming a gate; and
forming a dielectric layer above the body region and below the gate, the dielectric layer containing a hafnium tantalum oxide layer, the hafnium tantalum oxide being a bimetal oxide, the hafnium tantalum oxide layer formed as one or more monolayers by a layer-by-layer process having a plurality of cycles, each cycle including:
introducing a precursor containing hafnium to the substrate; and
introducing a precursor containing tantalum to the substrate such that a purging process is performed between introducing the precursor containing hafnium and introducing the precursor containing tantalum, wherein introducing each precursor is performed at a pressure, a substrate temperature, and pulsing parameters selected individually for each precursor to form hafnium titanium oxide in the cycle; and
forming a connection to couple the memory array to a bus.

20. The method of claim 19, wherein forming the gate includes forming the gate as a control gate, and forming the dielectric layer includes forming the dielectric layer as an inter-gate dielectric below the control gate and above a floating gate.

21. The method of claim 19, wherein the method is a method of forming a memory device including forming the dielectric layer as a gate insulator of a transistor in the memory device.

22. The method of claim 19, wherein the method is a method of forming a flash memory device including forming a second hafnium tantalum oxide layer by atomic layer deposition, the second hafnium tantalum oxide layer formed as part of an inter-gate insulator of a floating gate transistor in the flash memory device.

23. The method of claim 19, wherein the method is a method of forming a memory device including forming a second hafnium tantalum oxide layer by atomic layer deposition, the second hafnium tantalum oxide layer formed as part of a capacitor in the memory device.

24. The method of claim 19, wherein the method includes forming a dynamic random access memory.

25. A method comprising:
forming a memory array in a substrate including:
forming a source region and a drain region separated by a body region;
forming a gate; and
forming a dielectric layer above the body region and below the gate, the dielectric layer containing a hafnium tantalum oxide layer, the hafnium tantalum oxide layer formed as one or more monolayers by a process including:
introducing a precursor containing hafnium to the substrate, wherein pulsing the precursor containing hafnium includes a hafnium halide precursor; and
introducing a precursor containing tantalum to the substrate; and forming a connection to couple the memory array to a bus.

26. A method comprising:
forming a memory array in a substrate including:
forming a source region and a drain region separated by a body region;
forming a gate; and
forming a dielectric layer above the body region and below the gate, the dielectric layer containing a hafnium tantalum oxide layer, the hafnium tantalum oxide layer formed as one or more monolayers by a process including:
introducing a precursor containing hafnium to the substrate; and
introducing a precursor containing tantalum to the substrate, wherein pulsing the precursor containing tantalum includes pulsing tantalum halide precursor; and forming a connection to couple the memory array to a bus.

27. A method comprising:
forming a memory array in a substrate including:
forming a source region and a drain region separated by a body region;
forming a gate; and
forming a dielectric layer above the body region and below the gate, the dielectric layer containing a hafnium tantalum oxide layer, the hafnium tantalum oxide layer formed as one or more monolayers by a process including:
introducing a precursor containing hafnium to the substrate; and
introducing a precursor containing tantalum to the substrate, wherein pulsing a precursor containing tantalum includes pulsing a tantalum ethoxide precursor; and forming a connection to couple the memory array to a bus.

28. A method comprising:
providing a controller;
coupling an integrated circuit to the controller, wherein at least one of the integrated circuit or the controller includes a dielectric layer above a body region and below a gate, the body region separating a source region and a drain region, the dielectric layer containing a hafnium tantalum oxide layer, the hafnium tantalum oxide being a bimetal oxide, the hafnium tantalum oxide layer formed as one or more monolayers by a layer-by-layer process having a plurality of cycles, each cycle including:
pulsing a precursor containing tantalum onto a substrate; and
pulsing a precursor containing hafnium onto the substrate such that a purging process is performed between introducing the precursor containing hafnium and introducing the precursor containing tantalum, wherein introducing each precursor is performed at a pressure, a substrate temperature, and pulsing parameters selected individually for each precursor to form hafnium titanium oxide in the cycle.

29. The method of claim 28, wherein forming the gate includes forming the gate as a control gate and forming the dielectric layer includes forming the dielectric layer as an inter-gate dielectric below the control gate and above a floating gate.

30. The method of claim 28, wherein pulsing a precursor containing hafnium includes pulsing a hafnium nitrate precursor.

31. The method of claim 28, wherein pulsing a precursor containing tantalum includes pulsing at least one of a tantalum ethoxide precursor or a tantalum halide precursor.

32. The method of claim 28, wherein coupling an integrated circuit to the controller includes coupling a memory device as the integrated circuit.

33. The method of claim 28, wherein forming the hafnium tantalum oxide layer includes forming the hafnium tantalum oxide layer as a layer in the dielectric layer formed as a nanolaminate.

34. The method of claim 28, wherein forming the hafnium tantalum oxide layer includes forming the hafnium tantalum oxide layer as a layer in the dielectric layer formed as a nanolaminate having a tantalum oxide layer.

35. The method of claim 28, wherein forming the hafnium tantalum oxide layer includes forming the hafnium tantalum oxide layer as a layer in the dielectric layer formed as a nanolaminate having a hafnium oxide layer.

36. The method of claim 28, wherein providing a controller includes providing a processor.

37. The method of claim 28, wherein coupling an integrated circuit to the controller includes coupling a mixed signal integrated circuit as the integrated circuit.

38. The method of claim 28, wherein the method is a method of forming an information handling system.

* * * * *

UNITED STATES PATENT AND TRADEMARK OFFICE
CERTIFICATE OF CORRECTION

PATENT NO. : 7,560,395 B2  Page 1 of 1
APPLICATION NO. : 11/029757
DATED : July 14, 2009
INVENTOR(S) : Kie Y. Ahn et al.

It is certified that error appears in the above-identified patent and that said Letters Patent is hereby corrected as shown below:

On the title page, item (54), in "Title", in column 1, lines 1–2, delete "ATOMIC LAYER DEPOSITED HAFNIUM TANTALUM OXIDE DIELECTRICS" and insert -- METHODS FOR FABRICATING HAFNIUM TANTALUM OXIDE DIELECTRICS --, therefor.

In column 1, lines 1-2, delete "ATOMIC LAYER DEPOSITED HAFNIUM TANTALUM OXIDE DIELECTRICS" and insert -- METHODS FOR FABRICATING HAFNIUM TANTALUM OXIDE DIELECTRICS --, therefor.

Signed and Sealed this

First Day of September, 2009

David J. Kappos
*Director of the United States Patent and Trademark Office*